US007101649B2

(12) United States Patent
Inno

(10) Patent No.: US 7,101,649 B2
(45) Date of Patent: Sep. 5, 2006

(54) HEAT-SENSITIVE LITHOGRAPHIC PRINTING PLATE

(75) Inventor: Toshifumi Inno, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/777,686

(22) Filed: Feb. 13, 2004

(65) Prior Publication Data

US 2004/0166431 A1 Aug. 26, 2004

(30) Foreign Application Priority Data

Feb. 17, 2003 (JP) ............................ 2003-038329
Jul. 7, 2003 (JP) ............................ 2003-271377

(51) Int. Cl.
*G03F 7/004* (2006.01)

(52) U.S. Cl. ................ 430/138; 430/273.1; 430/280.1; 430/281.1; 430/286.1; 430/287.1; 430/288.1

(58) Field of Classification Search ................ 430/138, 430/270.1, 271.1, 273.1, 281.1, 286.1, 287.1, 430/288.1, 280.1
See application file for complete search history.

(56) References Cited

U.S. PATENT DOCUMENTS 6,596,455 B1 * 7/2003 Yanaka et al. .............. 430/138
6,632,580 B1 * 10/2003 Maemoto .................... 430/138
6,740,464 B1 * 5/2004 Maemoto .................... 430/138
6,818,372 B1 * 11/2004 Kunita et al. ............... 430/138
2004/0048191 A1 * 3/2004 Inno ........................ 430/270.1

FOREIGN PATENT DOCUMENTS

| | | | |
|---|---|---|---|
| EP | 1 132 200 | A2 * | 9/2001 |
| EP | 1160083 | A2 | 12/2001 |
| EP | 1203660 | A1 | 5/2002 |
| JP | 2938397 | B2 | 6/1999 |
| JP | 2001-277740 | A | 10/2001 |
| JP | 2002-29162 | A | 1/2002 |
| JP | 2002-46361 | A | 2/2002 |
| JP | 2002-137562 | A | 5/2002 |

* cited by examiner

*Primary Examiner*—Barbara L. Gilliam
(74) *Attorney, Agent, or Firm*—Birch, Stewart, Kolasch & Birch, LLP

(57) ABSTRACT

A heat-sensitive lithographic printing plate of the present invention, which enables image recording by infrared-ray scanning exposure based on digital data and has excellent on-press developability, high resistance to scumming and a long press life, the heat-sensitive lithographic printing plate having on a support with a hydrophilic surface an image-forming layer made up of microcapsules in which a reactive group-containing hydrophobic compound is enclosed, a light-to-heat converting agent and a water-soluble compound which has a reactive group capable of reacting with the hydrophobic compound and is situated outside the microcapsules.

18 Claims, No Drawings

HEAT-SENSITIVE LITHOGRAPHIC PRINTING PLATE

This Non-provisional application claims priority under 35 U.S.C. § 119(a) on Patent Application No(s). 2003-038329 and 2003-271377 filed in Japan on Feb. 17, 2003 and Jul. 7, 2003, respectively, the entire contents of which are hereby incorporated by reference.

FIELD OF THE INVENTION

The present invention relates to a heat-sensitive lithographic printing plate that enables platemaking by on-press development after recording of images by infrared-ray exposure based on digital data.

BACKGROUND OF THE INVENTION

Hitherto, making of lithographic printing plates has been performed using a system for exposing printing plate materials to light via litho films as intermediate materials. However, with the recent rapid progress of digitization in the field of graphic arts, the process of making printing plates is on its way to shifting to a CTP system that digital data input into a computer and manipulated therein are output directly to printing plate materials. Further, with a view toward evermore rationalizing the platemaking process, lithographic printing plate materials of the type which are exposed to light and subjected to printing operations without development processing, namely the type which eliminate the need for development processing, are being developed.

As a method of eliminating the processing operation, there is a method referred to as on-press development wherein an exposed printing plate material is mounted on the plate cylinder of a printing press and there to dampening water and ink are supplied as the plate cylinder is rotated: as a result, removal of the unexposed area of the image-forming layer is effected on the press. More specifically, this method is a manner of platemaking in which after exposure the printing plate material is mounted on a printing press as it is and development thereof is completed in the process of a usual printing operation. Lithographic printing plate materials suitable for such on-press development are required to have image-forming layers soluble in dampening water and ink solvents, and besides, it is advantageous that the plate materials are sensitive to infrared laser because they are developed on a printing press placed in an illuminated room, and so required to have illuminated room handling suitability.

As a lithographic printing plate material capable of the on-press development, for instance, Japanese Patent No. 2,938,397 discloses the heat-sensitive lithographic printing plate having a hydrophilic support provided with a hydrophilic image-forming layer containing fine particles of a thermoplastic hydrophobic polymer dispersed in a hydrophilic binderpolymer. In such a heat-sensitive lithographic printing plate, the fine particles of a thermoplastic hydrophobic polymer are fused and coalesced by heating caused upon exposure to infrared laser; as a result, a lipophilic imaging area is formed. When the resultant plate is mounted on the plate cylinder of a printing press as it is and a printing operation is started, the unexposed area is removed by dampening water and/or ink to begin with, namely on-press development is performed, and prints of good quality are obtained by further continuation of the printing operation.

In addition, JP-A-2001-277740 discloses the on-press developable heat-sensitive lithographic printing plate whose press life is improved by use of thermally reactive compound-enclosed microcapsules.

Further, JP-A-2002-29162 discloses that a satisfactory press life can be attained with the on-press developable heat-sensitive lithographic printing plate having an image-forming layer containing microcapsules in which a vinyloxy group-containing compound is enclosed, a hydrophilic resin and an acid precursor.

Furthermore, JP-A-2002-46361 discloses that a satisfactory press life can be attained with the on-press developable heat-sensitive lithographic printing plate having an image-forming layer containing microcapsules in which an epoxy group-containing compound is enclosed, a hydrophilic resin and an acid precursor.

Additionally, JP-A-2002-137562 discloses that a satisfactory press life can be attained with the on-press developable heat-sensitive lithographic printing plate having an image-forming layer containing microcapsules in which a radical-polymerizable group containing compound is enclosed, a hydrophilic resin and a heat-sensitive radical generator.

SUMMARY OF THE INVENTION

Although the heat-sensitive lithographic printing plates using the arts mentioned above have improved press life, they have a problem that on-press developability thereof is insufficient and scum tends to develop thereon. Therefore, the invention aims at solving this problem. More specifically, an object of the invention is to provide a heat-sensitive lithographic printing plate having excellent on-press developability, resistance to scumming and a long press life.

The invention includes the following embodiments.

1. A heat-sensitive lithographic printing plate comprising: a support with a hydrophilic surface; and an image-forming layer containing a microcapsule, a light-to-heat converting agent and a water-soluble compound;

wherein the microcapsule contains a reactive group-containing hydrophobic compound, the water-soluble compound has a reactive group capable of reacting with the hydrophobic compound and the image-forming layer contains the water-soluble compound outside the microcapsule.

2. The heat-sensitive lithographic printing plate as described in the item 1, wherein the reactive group in the reactive group-containing hydrophobic compound is an epoxy group or a vinyloxy group, and the reactive group in the water-soluble compound is an epoxy group or a vinyloxy group.

3. The heat-sensitive lithographic printing plate as described in the item 1 or 2, wherein each of the reactive group in the reactive group-containing hydrophobic compound and the reactive group in the water-soluble compound is a radical-polymerizable ethylenic unsaturated group.

4. The heat-sensitive lithographic printing plate as described in any one of the items 1 to 3, wherein the reactive group-containing hydrophobic compound has at least two of the reactive groups in the molecule.

5. The heat-sensitive lithographic printing plate as described in the item 4, wherein the reactive group-containing hydrophobic compound has at least two of vinyloxy groups in the molecule.

6. The heat-sensitive lithographic printing plate as described in the item 5, wherein the reactive group-containing hydrophobic compound is a vinyl ether group-containing compound represented by the following formula (II) or (III):

$$A\text{-}[—O—(R^4—O)_n—CH{=}CH_2]_m \quad (II)$$

$$A\text{-}[—B—R^4—O—CH{=}CH_2]_m \quad (III)$$

wherein A represents an m-valent saturated hydrocarbon group, aromatic hydrocarbon group or heterocyclic group, B represents —CO—O—, —NHCOO— or —NHCONH—, $R^4$ represents a straight-chain or branched alkylene group containing 1 to 10 carbon atoms, n represents an integer of 0 to 10, and m represents an integer of 2 to 6.

7. The heat-sensitive lithographic printing plate as described in the item 1, wherein the reactive group-containing hydrophobic compound is a vinyloxy group-containing compound obtained by reaction of a active hydrogen-containing vinyloxy compound represented by the following formula (IV), (V) or (VI) with an isocyanate group-containing compound:

$$CH_2{=}CH—O—R^5—OH \quad (IV)$$

$$CH_2{=}CH—O—R^5—COOH \quad (V)$$

$$CH_2{=}CH—O—R^5—NH_2 \quad (VI)$$

wherein $R^5$ represents a straight-chain or branched alkylene group containing 1 to 10 carbon atoms.

8. The heat-sensitive lithographic printing plate as described in the item 4, wherein the reactive group-containing hydrophobic compound has at least two of epoxy groups in the molecule.

9. The heat-sensitive lithographic printing plate as described in the item 4, wherein the reactive group-containing hydrophobic compound has at least two of radical-polymerizable ethylenic unsaturated groups.

10. The heat-sensitive lithographic printing plate as described in the item 9, wherein the radical-polymerizable ethylenic unsaturated group includes at least one of an acryloyl, methacryloyl, vinyl and allyl group.

11. The heat-sensitive lithographic printing plate as described in the item 1, wherein the reactive group-containing hydrophobic compound is a glycidyl ether compound obtained by reaction of a polyhydric alcohol or polyhydric phenol with epichlorohydrin or prepolymer thereof.

12. The heat-sensitive lithographic printing plate as described in the item 1, wherein the water-soluble compound has at least two reactive groups capable of reacting with the hydrophobic compound in the molecule.

13. The heat-sensitive lithographic printing plate as described in the item 12, wherein the at least two reactive groups include a radical-polymerizable ethylenic unsaturated group.

14. The heat-sensitive lithographic printing plate as described in the item 12, wherein the at least two reactive groups include a vinyloxy group.

15. The heat-sensitive lithographic printing plate as described in the item 12, wherein the at least two reactive groups include an epoxy group.

16. The heat-sensitive lithographic printing plate as described in the item 1, wherein the water-soluble compound has at least one of an ethylene oxide chain and a propylene oxide chain in the molecule.

17. The heat-sensitive lithographic printing plate as described in the item 16, wherein the water-soluble compound has the at least one of an ethylene oxide chain and a propylene oxide chain in an amount of 1 to 40 units.

18. The heat-sensitive lithographic printing plate as described in any one of the items 1 to 17, wherein the image-forming layer contains the water-soluble compound in an amount of 0.1 to 15% by weight.

19. The heat-sensitive lithographic printing plate as described in any one of the items 1 to 20, wherein the water-soluble compounds has a molecular weight of 2,000 or below.

20. The heat-sensitive lithographic printing plate as described in any one of the items 1 to 19, wherein the image-forming layer further contains a hydrophilic resin.

21. The heat-sensitive lithographic printing plate as described in any one of the items 1 to 20, wherein the image-forming layer further contains a reaction accelerator capable of initiating or accelerating the reaction between the reactive groups of the hydrophobic compound and the water-soluble compound.

22. The heat-sensitive lithographic printing plate as described in any one of the items 1 to 21, which further comprises an overcoat layer containing a water-soluble resin on the image-forming layer.

The essence of the invention is that, by imparting reactivity to the water-soluble compound added to the image-forming layer with the intention of enhancing the on-press developability, a drawback involved in the arts hitherto known, namely a drawback that on-press developability improvements are accompanied by diminution of press life, is overcome and the compatibility between an improvement in on-press developability and an improvement in press life is attained.

In accordance with the invention, it becomes possible to provide a heat-sensitive lithographic printing plate which permits the image recording by infrared scanning exposure based on digital data and has excellent on-press developability, resistance to scumming and high impression capacity.

DETAILED DESCRIPTION OF THE INVENTION

Modes for carrying out the invention are illustrated below in detail.

<Image-Forming Layer>

The image-forming layer of the present heat-sensitive lithographic printing plate contains: microcapsules in which a reactive group-containing hydrophobic compound is enclosed; a light-to-heat converting agent; and a water-soluble compound which has a reactive group capable of reacting with the hydrophobic compound and is situated outsides the microcapsules.

(Water-Soluble Compound)

Examples of a reactive group which is contained in a water-soluble compound and features in the invention include reactive groups cross-linkable by acids, such as a cation-polymerizable group and a ring opening-polymerizable group, and reactive groups polymerizable by radicals (radical-polymerizable groups).

Examples of a cation-polymerizable group and a ring opening-polymerizable group include aliphatic olefin residues, styrene residues, vinyl ether residues, N-vinyl compound residues, acetylene derivative residues, cyclic ether residues, cyclic sulfide residues, cyclicimine residues and cyclic formal residues. Of these residues, a vinyloxy group and an epoxy group are preferred over the others.

Examples of a radical-polymerizable group include ethylenic unsaturated groups, such as an acryloyl group, a methacryloyl group, a vinyl group and an allyl group.

The vinyloxy group suitable for the invention includes those represented by the following formula (I):

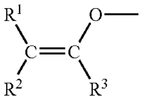

(I)

wherein $R^1$, $R^2$ and $R^3$, which may be the same or different, each represent a hydrogen atom, an alkyl group, an alkenyl group or an aryl group, or any two of them combine with each other to form a saturated or olefinic unsaturated ring.

More specifically, when any of $R^1$, $R^2$ and $R^3$ in formula (I) is an aryl group, the aryl group generally contains 6 to 20 carbon atoms, and may be substituted with an alkyl group, an aryl group, an alkoxy group, an aryloxy group, an acyl group, an acyloxy group, an alkylmercapto group, an acylamino group, an alkoxycarbonyl group, a nitro group, a sulfonyl group, a cyano group or a halogen atom. When any of $R^1$, $R^2$ and $R^3$ is an alkyl or alkenyl group, the group generally has a linear, branched or cyclic carbon chain containing 1 to 20 carbon atoms, and may be substituted with a halogen atom, a cyano group, an alkoxycarbonyl group, a hydroxyl group, an alkoxy group, an aryloxy group or an aryl group. When two among $R^1$, $R^2$ and $R^3$ combine with each other to form a ring together with the carbon atom or atoms of the vinyl group, the ring formed is generally a 3- to 8-membered, preferably a 5- or 6-membered, saturated or unsaturated ring.

Of the vinyloxy groups represented by formula (I), the vinyloxy groups which each contain a methyl group or an ethyl group as one of $R^1$, $R^2$ and $R^3$ and hydrogen atoms as the rest are preferred over the others in the invention. And the vinyloxy group whose $R^1$, $R^2$ and $R^3$ are all hydrogen atoms (or vinyl ether group) is especially advantageous.

The present water-soluble compound contains the reactive group as recited above in a main chain, a side chain or a terminal of the molecule, and reacts with a hydrophobic compound oozing out of a microcapsule when heat is generated by exposure.

It is preferable that the present reactive group-containing water-soluble compound (also referred to as the water-soluble reactive compound, hereinafter) has at least two of the reactive groups per molecule.

Further, the suitable molecular weight of the present water-soluble reactive compound is 2,000 or below, preferably 1,000 or below, in terms of on-press developability and reactivity.

Examples of such a water-soluble reactive compound include compounds obtained by modifying terminals of polyhydric alcohols (such as ethylene glycol, propylene glycol, butanediol, pentyl glycol, glycerin, trimethylolpropane, pentaerythritol, dipentaerythritol, bisphenol A, hydrogenated bisphenol A, sorbitan and sorbitol) or terminals of ethylene oxide chain-(abbreviated as "EO", hereinafter) and/or propylene oxide chain-containing polyhydric alcohols prepared by addition of ethylene oxide and/or propylene oxide to the polyhydric alcohols as recited above into glycidyl ethers, vinyl ethers, allyl ethers, acrylates or methacrylates.

In addition, phosphoric acid monoester or diester of alcohol obtained by modifying one terminal of dihydric alcohol having an ethylene oxide chain and/or a propylene oxide chain into glycidyl ether, vinyl ether, allyl ether, acrylate or methacrylate is also suitable as the present water-soluble reactive compound.

Suitable examples of the present water-soluble reactive compound include the compounds illustrated below, but these compounds should not be construed as limiting the scope of the invention.

(1)

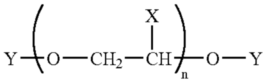

(2)

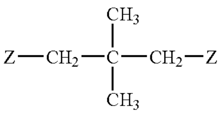

(3)

$Z-(CH_2)_4-Z$ (4)

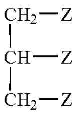

(5)

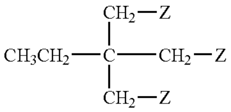

(6)

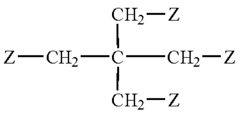

(7)

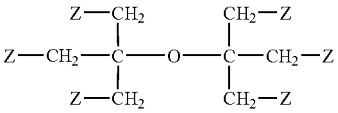

(8)

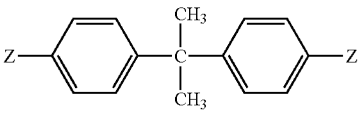

(9)

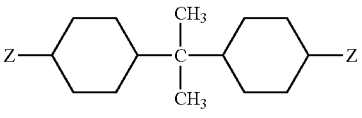

(10)

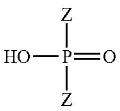

In the above formulae, X represents a hydrogen atom or a methyl group, Ys represent groups having the structures illustrated below and they may be the same or different, and Zs represent groups having the structures illustrated below and they may be the same or different in each molecule. Further, one of Ys and a part of Zs in each molecule may be OH group(s) n represents the number of ethylene oxide or propylene oxide units. The sum total of numbers of ethylene oxide and propylene oxide units present in substituents of each compound molecule is preferably an integer of 0 to 40, far preferably 20 or below.

Y: 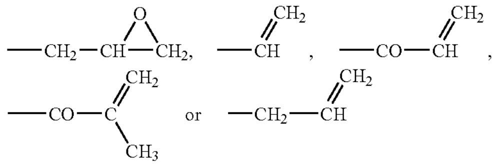

Z: 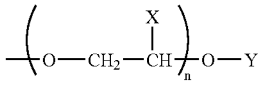

The water-soluble reactive compounds as recited above can be used as a mixture of two or more thereof, if needed. The suitable amount of water-soluble reactive compound(s) added to the image-forming layer is from 0.1 to 15 mass %, preferably from 0.5 to 10 mass %, of the total solids in the image-forming layer. As far as the addition amount is within the foregoing range, on-press developability can be enhanced without reduction in press life.

(Microcapsule)

The present reactive group-containing hydrophobic compound enclosed in microcapsules is a hydrophobic compound having a reactive group such as the acid cross-linkable group as recited above (e.g., cation-polymerizable group, ring opening-polymerizable group) or the radical-polymerizable reactive group (radical-polymerizable group). Of these reactive groups the hydrophobic compound can have, vinyloxy and epoxy compounds are preferred over the others. In addition, radical-polymerizable ethylenic unsaturated groups are also suitable.

The present hydrophobic compound is preferably a compound having two or more of vinyloxy groups represented by formula (I). When two or more vinyloxy groups are present in the compound, cross-linking reaction takes place with efficiency. Such a compound is a compound having a boiling point of 600° C. or higher under atmospheric pressure, with suitable examples including vinyl ether group-containing compounds represented by the following formula (II) or (III):

$$A\text{-}[\text{—O—}(R^4\text{—O})_n\text{—CH=CH}_2]_m \quad \text{(II)}$$

$$A\text{-}[\text{—B—}R^4\text{—O—CH=CH}_2]_m \quad \text{(III)}$$

wherein A represents an m-valent saturated hydrocarbon group, aromatic hydrocarbon group or heterocyclic group, B represents —CO—O—, —NHCOO—or —NHCONH—, $R^4$ represents a straight-chain or branched alkylene group containing 1 to 10 carbon atoms, n represents an integer of 0 to 10, and m represents an integer of 2 to 6. The m-valent saturated hydrocarbon group, aromatic hydrocarbon group and heterocyclic group each may have a hetero atom and a substituent, and the number of carbon atom in the m-valent saturated hydrocarbon group is preferably 1 to 60, more preferably 3 to 50, still more preferably 5 to 40, and the number of carbon atom in each of the m-valent aromatic hydrocarbon group and heterocyclic group is preferably 6 to 70, more preferably 8 to 60, still more preferably 10 to 50.

The compounds represented by formula (II) can be synthesized using the method described, e.g., in Stephen C. Lapin, *Polymers Paint Colour Journal*, 179(4237), 321 (1988), more specifically by reaction of acetylene with polyhydric alcohols or polyhydric phenols, or by reaction of halogenated alkyl vinyl ethers with polyhydric alcohols or polyhydric phenols.

Examples of compounds represented by formula (II) include ethylene glycol divinyl ether, triethylene glycol divinyl ether, 1,3-butanediol divinyl ether, tetramethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylenevinyl ether, triethylene glycol diethylenevinyl ether, ethylene glycol dipropylenevinyl ether, triethylene glycol diethylenevinyl ether, trimethylolpropane triethylenevinyl ether, trimethylolpropane diethylenevinyl ether, pentaerythritol diethylenevinyl ether, pentaerythritol triethylenevinyl ether, pentaerythritol tetraethylenevinyl ether, 1,2-di(vinylethermethoxy)benzene, 1,2-di(vinyletherethoxy)benzene, and the compounds illustrated by the following structural formulae (M-1) to (M-41), respectively. However, these examples should not be construed as limiting the scope of the invention.

(M-1)

(M-2)

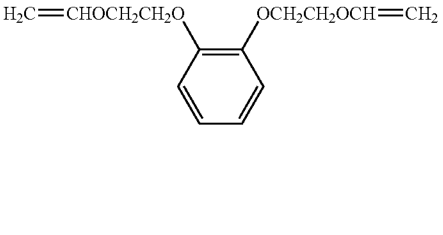

(M-3)

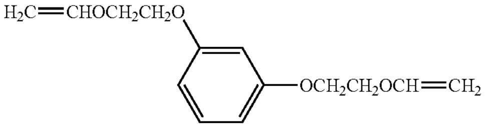

(M-4)

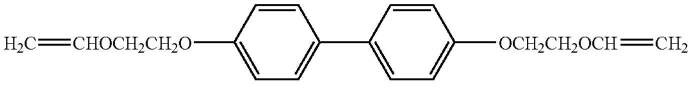

-continued
(M-5)
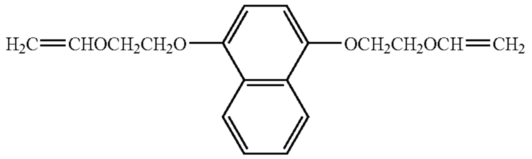
(M-6)
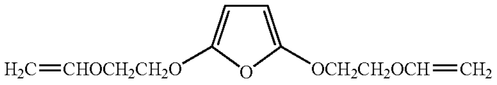
(M-7)
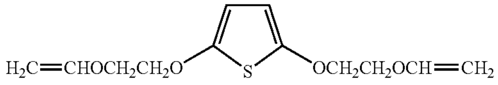
(M-8)
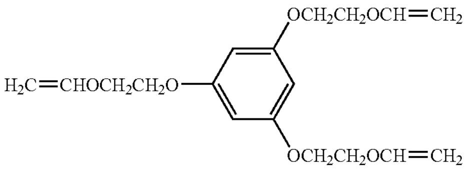
(M-9)
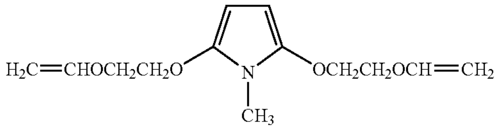
(M-10)
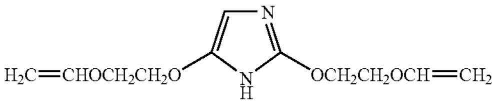
(M-11)
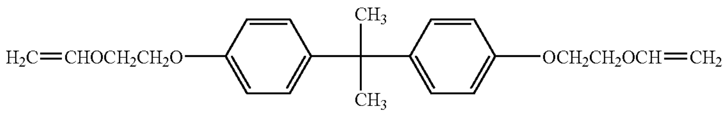
(M-12)
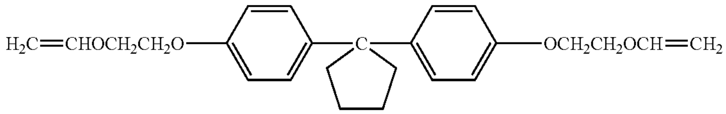
(M-13)
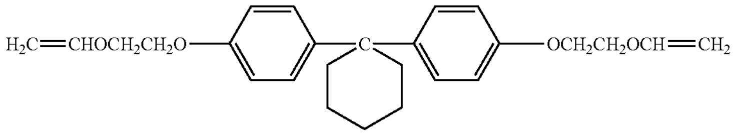
(M-14)
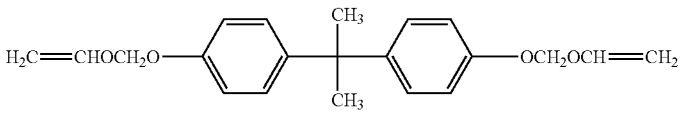
(M-15)
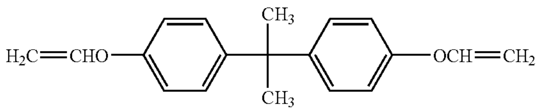
(M-16)
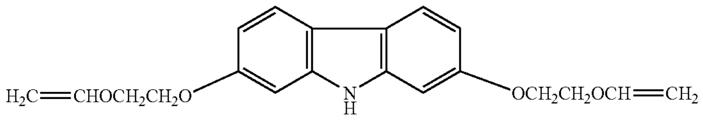
(M-17)
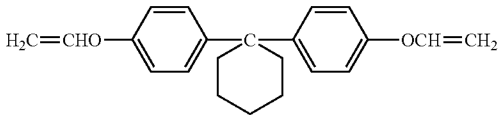
(M-18)
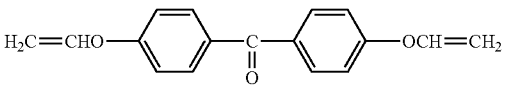
(M-19)
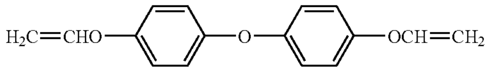
(M-20)
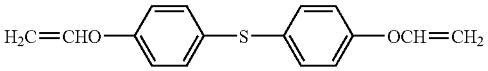

-continued
(M-21)
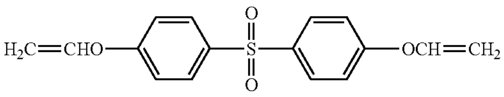
(M-22)
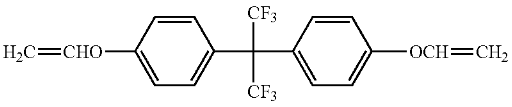
(M-23)
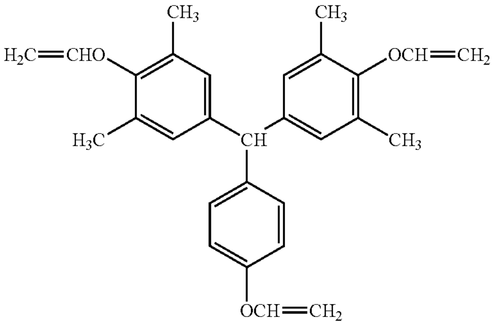
(M-24)
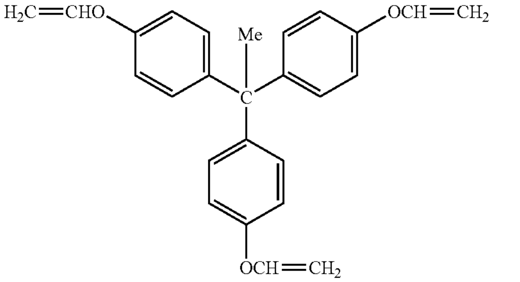
(M-25)
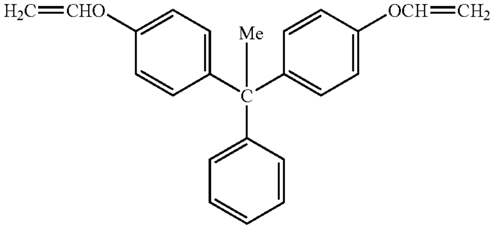
(M-26)
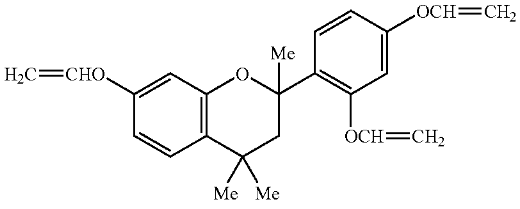
(M-27)
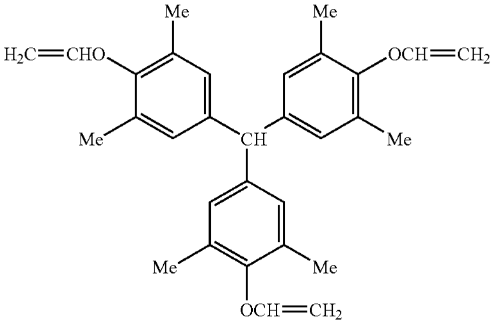
(M-28)
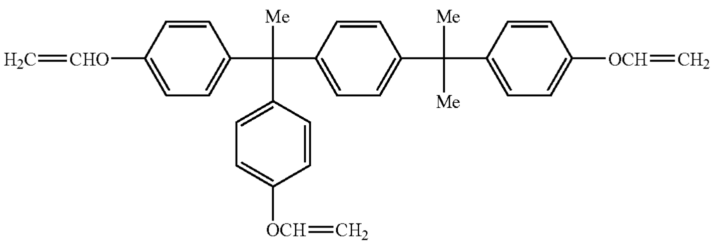

-continued
(M-29)
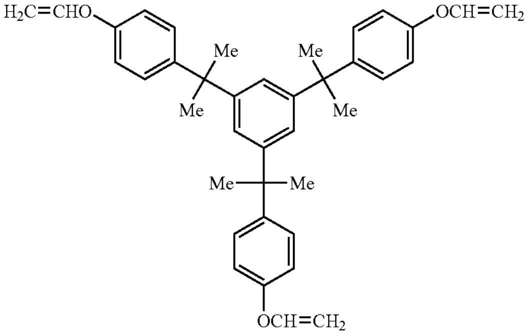
(M-30)
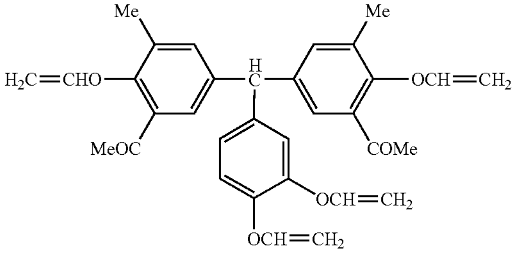
(M-31)
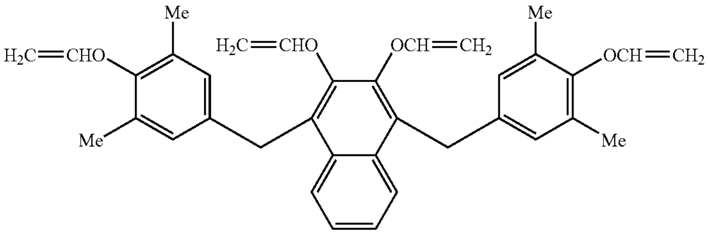
(M-32)
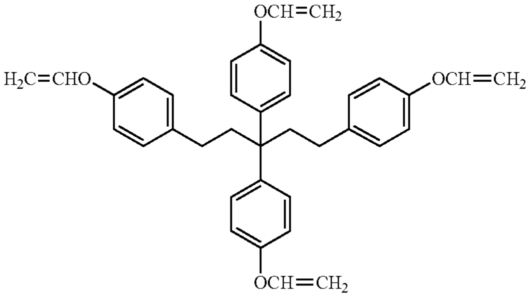
(M-33)
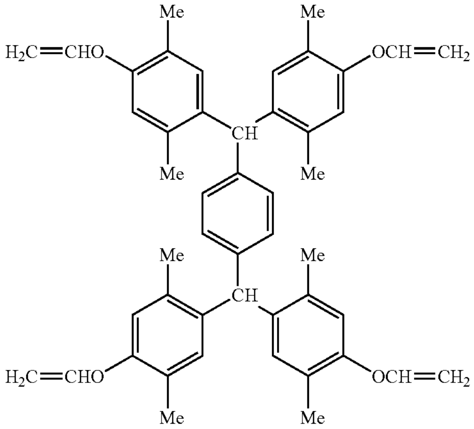
(M-34)
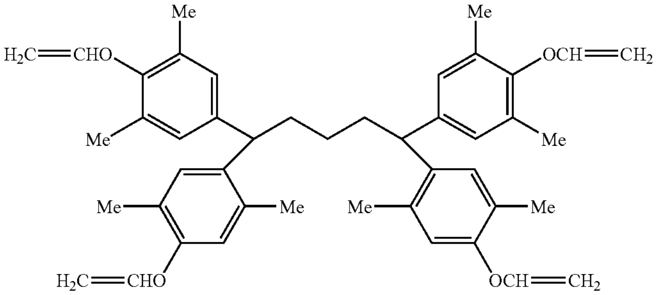
(M-35)
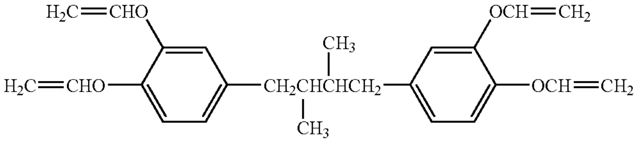

-continued (M-36)

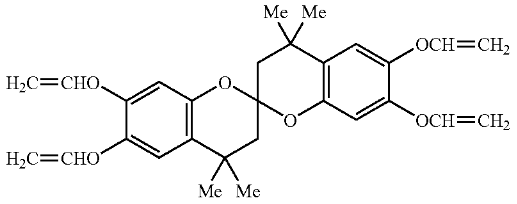

(M-37)

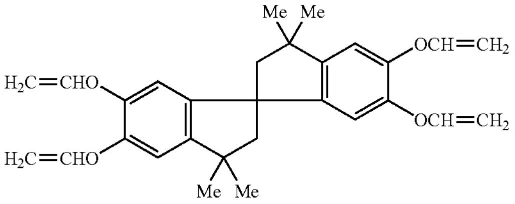

(M-38)

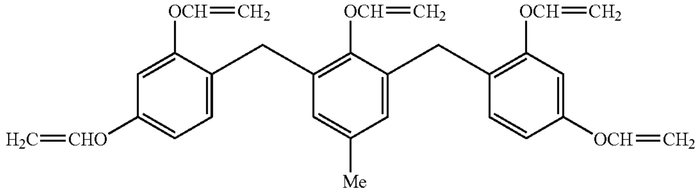

(M-39)

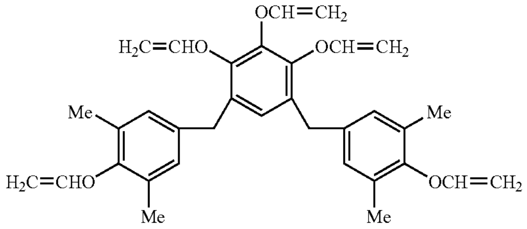

(M-40)

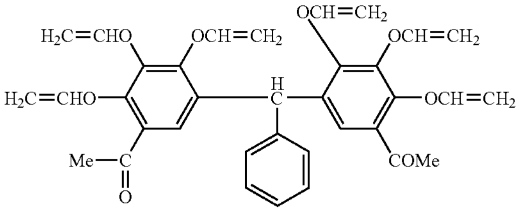

(M-41)

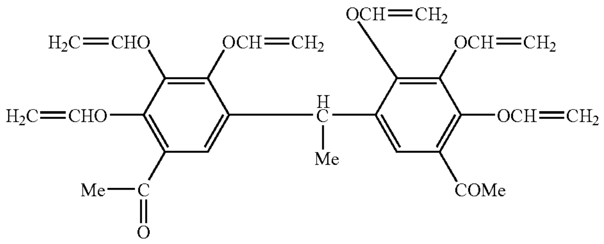

On the other hand, the compounds represented by formula (III) can be produced, e.g., for the case where B is —CO—O—, by reaction of polycarboxylic acids with halogenated alkyl vinyl ethers. Examples of such compounds include di(vinyloxyethylene) terephthalate, di(vinyloxyethylene) phthalate, di(vinyloxyethylene) isophthalate, di(vinyloxypropylene) phthalate, di(vinyloxypropylene) terephthalate, di(vinyloxypropylene) isophthalate, di(vinyloxyethylene) maleate, di(vinyloxyethylene) fumarate, and di(vinyloxyethylene) itaconate. However, these examples should not be construed as limiting the scope of the invention.

Further examples of vinyloxy group-containing compounds suitably used in the invention include vinyloxy group-containing compounds synthesized by reaction of active hydrogen-containing vinyloxy compounds represented by the following formula (IV), (V) or (VI) with isocyanate group-containing compounds:

$$CH_2{=}CH{-}O{-}R^5{-}OH \qquad (IV)$$

$$CH_2{=}CH{-}O{-}R^5{-}COOH \qquad (V)$$

$$CH_2{=}CH{-}O{-}R^5{-}NH_2 \qquad (VI)$$

wherein $R^5$ represents a straight-chain or branched alkylene group containing 1 to 10 carbon atoms. As the isocyanate group-containing compounds, the compounds described, e.g., in *Kakyouzai Handbook* (which might be translated "Handbook of Cross-linking Agents"), published by Taiseisha in 1981, can be used.

Examples of such compounds include compounds of polyisocyanate type, such as triphenylmethanetriisocyanate, diphenylmethanediisocyanate, tolylenediisocyanate, 2,4-tolylenediisocyanate dimer, naphthalene-1,5-diisocyanate, o-tolylenediisocyanate, polymethylenepolyphenylisocyanate and hexamethylenediisocyanate; and compounds of polyisocyanate adduct type, such as an adduct of tolylenediisocyanate and trimethylolpropane, an adduct of hexamethylenediisocyanate and water, and an adduct of xylenediisocyanate and trimethylolpropane.

By reacting the isocyanate group-containing compounds as recited above with active hydrogen-containing vinyloxy compounds, various compounds having vinyloxy groups at their individual terminals can be produced. Examples of hydrophobic compounds usable in the invention, which are produced in the foregoing ways, are illustrated below. However, these examples should not be construed as limiting the scope of the invention.

(M-42)
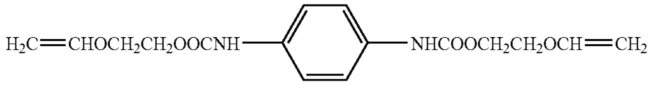
(M-43)
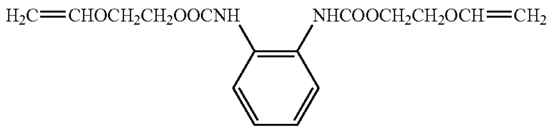
(M-44)
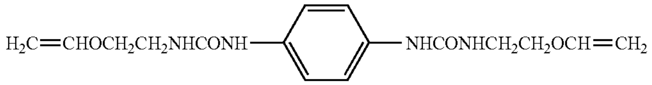
(M-45)
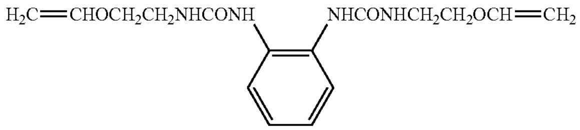
(M-46)
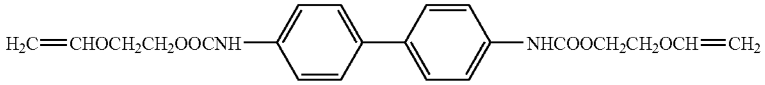
(M-47)
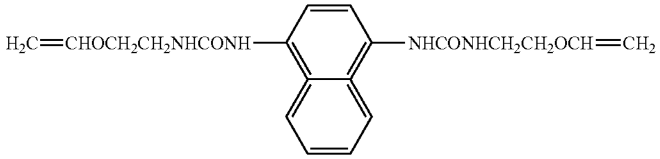
(M-48)
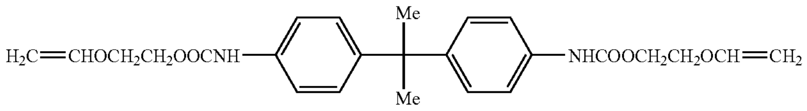
(M-49)
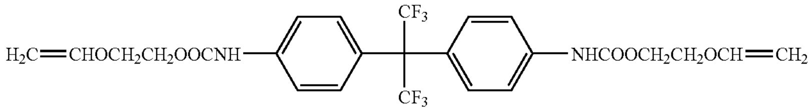
(M-50)
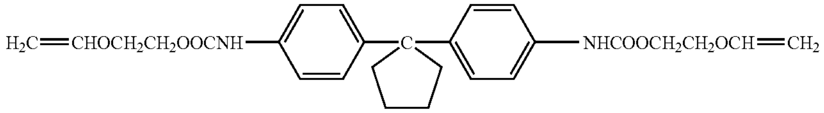
(M-51)
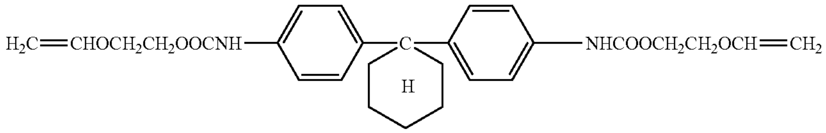
(M-52)
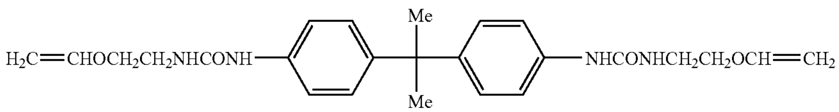
(M-53)
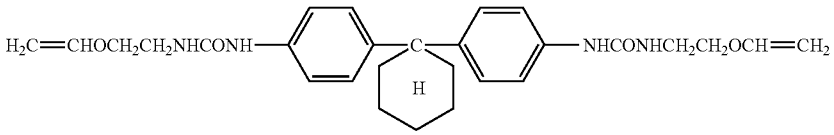

-continued
(M-54)
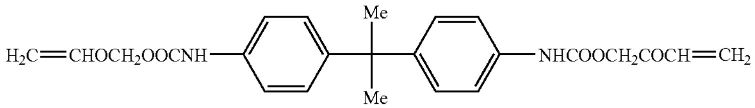
(M-55)
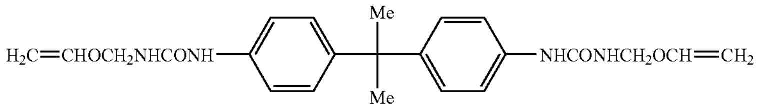
(M-56)
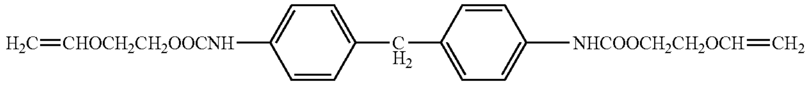
Furthermore, polymers having vinyloxy groups in their individual side chains can be used as the present hydrophobic compounds. Examples of such polymers are illustrated below.
(P-1)
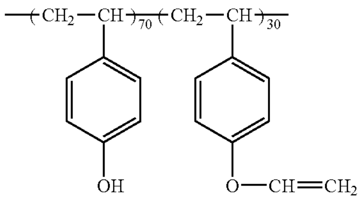
(P-2)
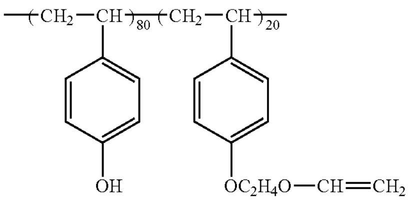
(P-3)
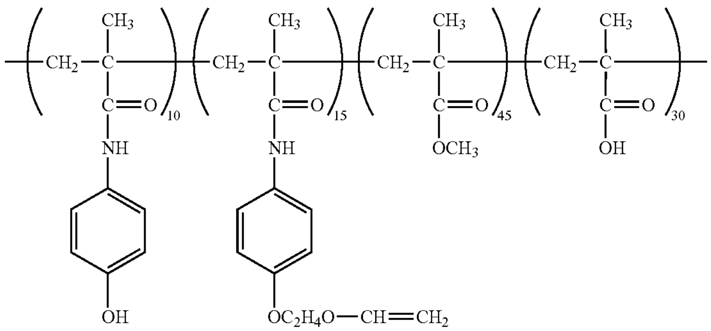
(P-4)
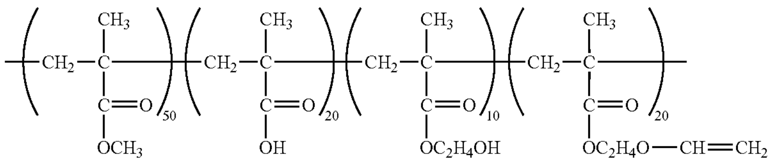
(P-5)
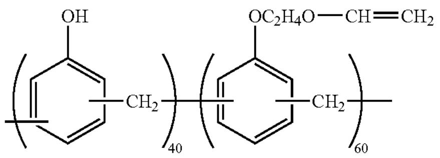
(P-6)
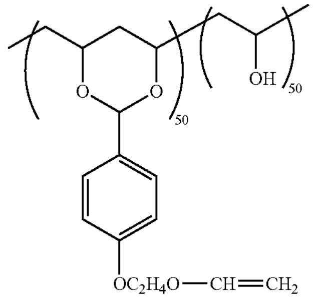

-continued (P-7)

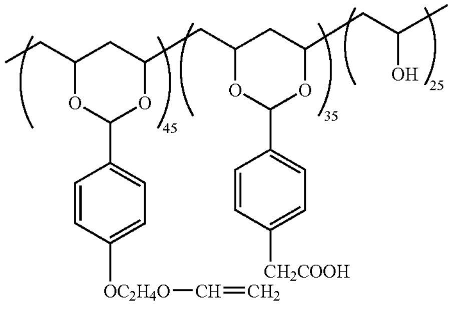

(P-8)

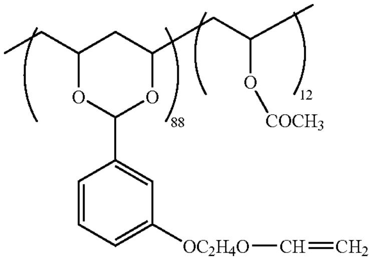

(P-9)

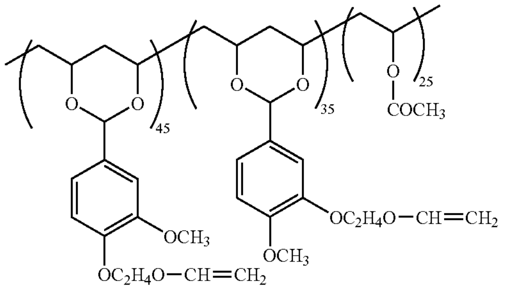

Examples of epoxy group-containing hydrophobic compounds usable in the invention include glycidyl ether compounds obtained by reaction of polyhydric alcohols or polyhydric phenols with epichlorohydrin, or their prepolymers; and glycidyl acrylate or methacrylate homo- or copolymers. Of these compounds, those containing at least two epoxy groups per molecule are preferred over the others.

Suitable examples of such compounds include propylene glycol diglycidyl ether, tripropylene glycol diglycidyl ether, polypropylene glycol diglycidyl ether, neopentyl glycol diglycidyl ether, trimethylolpropane triglycidyl ether, diglycidyl ether of hydrogenated bisphenol A, hydroquinone diglycidyl ether, resorcinol diglycidyl ether, diglycidyl ether or epichlorohydrin polyaddition product of bisphenol A, diglycidyl ether or epichlorohydrin polyaddition product of bisphenol F, diglycidyl ether or epichlorohydrin polyaddition product of halogenated bisphenol A, glycidyl etherified product of novolak resin, methyl methacrylate-glycidyl methacrylate copolymer and ethyl methacrylate-glycidyl methacrylate copolymer.

Examples of epoxy group-containing compounds which are commercially available include Epikote 1001 (molecular weight: about 900; epoxy equivalent weight: 450–500), Epikote 1002 (molecular weight: about 1,600; epoxy equivalent weight: 600–70), Epikote 1004 (molecular weight: about 1,060; epoxy equivalent weight; 875–975), Epikote 1007 (molecular weight: about 2,900; epoxy equivalent weight: 2,000), Epikote 1009 (molecular weight: bout 3,750; epoxy equivalent weight: 3,000), Epikote 1010 (molecular weight: about 5,000; epoxy equivalent weight: 4,000), Epikote 1100L (epoxy equivalent weight: 4,000) and Epikote YX31575 (epoxy equivalent weight: 1,200), which are products of Japan Epoxy Resins Co., Ltd., and Sumiepoxy ESCN-195XHN, ESCN-195XL and ESCN-295XF produced by Sumitomo Chemical Co., Ltd.

As radical-polymerizable group-containing hydrophobic compounds used in the invention, compounds having at least, two ethylenic unsaturated double bonds per molecule are suitable. A group of such compounds are well known in the industrial field concerned, and can be used in the invention without imposing any particular restrictions thereon. Those compounds have chemical forms, such as a monomer form, a prepolymer form, such as a dimer, trimer or oligomer form, and a homo- or copolymer form. They may be used alone, or as mixtures of two or more thereof. In the case of using compounds with homo- and copolymer forms, ethylenic unsaturated double bonds, such as those contained in acryloyl, methacryloyl, vinyl and allyl groups, may be introduced into the compounds at the time of polymerization, or through the use of macromolecular reaction after polymerization.

Examples of such compounds include unsaturated carboxylic acids (such as acrylic acid, methacrylic acid, itaconic acid, crotonic acid, isocrotonic acid and maleic acid), and their esters and amides, preferably unsaturated carboxylic acid esters of aliphatic polyhydric alcohols and unsaturated carboxylic acid amides of aliphatic polyamines. Further, it is also suitable to use addition products of unsaturated carboxylic acid esters or unsaturated carboxylic acid amides having nucleophilic substituents, such as a hydroxyl group, an amino group and a mercapto group, and monofunctional or polyfunctional isocyanates or epoxides, and dehydration condensation products of the above esters or amides and monofunctional or polyfunctional carboxylic acids.

In addition, addition products of unsaturated carboxylic acid esters or amides having electrophilic substituents, such as an isocyanate group and an epoxy group, and monofunctional or polyfunctional alcohol, amine and thiol, and substitution reaction products of unsaturated carboxylic acid esters or amides having eliminable substituents, such as a halogeno group and a tosyloxy group, and monofunctional or polyfunctional alcohol, amine and thiol are also suitable. Examples of other compounds used suitably include the above-recited compounds whose unsaturated carboxylic acids are replaced by unsaturated phosphonic acids or chloromethylstyrenes.

As to the radical-polymerizable compounds which are unsaturated carboxylic acid esters of aliphatic polyhydric alcohol compounds, their examples for the case of acrylic acid esters include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolmethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomers.

Examples for the case of methacrylic acid esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxyethoxy-2-hydroxy-propoxy)phenyl]-dimethylmethane and bis[p-(methacryloxy-ethoxy)phenyl]-dimethylmethane.

Examples for the case of itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

Examples for the case of crotonic acid esters include ethylene glycol dicrotonate, tetramethylene glycol dicrotonate, pentaerythritol dicrotonate and sorbitol tetracrotonate.

Examples for the case of isocrotonic acid esters include ethylene glycol diisocrotonate, pentaerythritol diisodrotonate and sorbitol tetraisocrotonate.

Examples for the case of maleic acid esters include ethylene glycol dimaleate, triethylene glycol dimaleate, pentaerythritol dimaleate and sorbitol tetramaleate.

Suitable examples of other esters include the aliphatic alcohol-derived esters as disclosed in JP-B-46-27926, JP-B-51-47334 and JP-A-57-196231, the esters having aromatic skeletons as disclosed in JP-A-59-5240, JP-A-59-5241 and JP-A-2-226149, and the amino group-containing esters disclosed in JP-A-1-165613.

On the other hand, examples of amide monomers prepared from aliphatic polyamine compounds and unsaturated carboxylic acids include methylenebisacrylamide, methylenebismethacrylamide, 1,6-hexamethylenebisacrylamide, 1,6-hexamethylenebismethacrylamide, diethylenetriamintrisacrylamide, xylylenebisacrylamide and xylylenebismethacrylamide.

In addition to the amide monomers of the foregoing type, the amide monomers having cyclohexylene structures disclosed in JP-B-54-21726 are suitable. Further, urethane polyaddition compounds produced utilizing addition reaction between isocyanate and hydroxyl group are also suitable. Examples of such compounds include the vinylurethane compounds containing two or more polymerizable vinyl groups per molecule as disclosed in JP-B-48-41708, specifically the addition products of polyisocyanate compounds containing two or more isocyanate groups per molecule and hydroxyl group-containing vinyl monomers represented by the following formula (VII):

$$CH_2{=}C(R^{01})COOCH_2CH(R^{02})OH \qquad (VII)$$

(wherein $R^{01}$ and $R^{02}$ each represent H or CH3).

Furthermore, the urethaneacrylates as disclosed in JP-A-51-37193, JP-B-2-32293 and JP-B-2-16765, and the ethylene oxide skeleton-containing urethane compounds disclosed in JP-B-58-49860, JP-B-56-17654, JP-B-62-39417and JP-B-62-39418 are also used to advantage. In addition, the radical-polymerizable compounds having amino structures or sulfide structures in their respective molecules as disclosed in JP-A-63-277653, JP-A-63-260909 and JP-A-1-105238 may be used.

Other examples of hydrophobic compounds according to the invention include the polyfunctional acrylates and methacrylates as disclosed in JP-A-48-64183, JP-B-49-43191 and JP-B-52-30490, including the polyester acrylates and the epoxy (meth)acrylates prepared by reaction of epoxy resins with (meth)acrylic acid; the specific unsaturated compounds disclosed in JP-B-46-43946, JP-B-1-40337, JP-B-1-40336; and the vinylphosphonic acid compounds disclosed in JP-A-2-25493. In some cases, the perfluoroalkyl group-containing structures disclosed in JP-A-61-22048 can be used favorably. Additionally, the compounds introduced as light cure monomers and oligomers in *Nippon Secchaku Kyokai-Shi*, vol. 20, No. 7, pp. 300–308 (1984), can be used, too.

The aforementioned reactive group-containing compounds can be microencapsulated in accordance with known methods. Examples of a method applicable to formation of microcapsules include the methods of utilizing coacervation as disclosed in U.S. Pat. Nos. 2,800,457 and 2,800,458; the methods based on interfacial polymerization as disclosed in GB Patent No. 990,443, U.S. Pat. No. 3,287,154, JP-A-38-19574, JP-A-42-446 and JP-A-42-711; the methods based on precipitation of polymers as disclosed in U.S. Pat. Nos. 3,418,250 and 3,660,304; the method of using an isocyanatepolyol wall material as disclosed in U.S. Pat. No. 3,796,669; the method of using an isocyanate wall material as disclosed in U.S. Pat. No. 3,914,511; the methods of using urea-formaldehyde or urea-formaldehyde-resorcinol wall-forming materials as disclosed in U.S. Pat. Nos. 4,001,140, 4,087,376 and 4,089,802; the method of using a wall material such as melamine-formaldehyde resin or hydroxyl cellulose as disclosed in U.S. Pat. No. 4,025,445; the method based on in situ polymerization of monomers as disclosed in JP-A-36-9163 and JP-A-51-9079; the spray drying methods as disclosed in GB Patent No. 930,422 and U.S. Pat. No. 3,111,407; and the electrolytic dispersion cooling methods disclosed in GB Patent Nos. 952,807 and 967,074. However, these examples should not be construed as limiting the scope of the invention.

It is appropriate that the microcapsule wall used in the invention have three-dimensional cross-links and the property of swelling in solvents. From these points of view, polyurea, polyurethane, polyester, polycarbonate, polyamide and mixtures of two or more of these polymers are suitable as the microcapsule wall materials. Of these materials, polyurea and polyurethane are preferred over the others. The reactive group-containing compounds may be introduced into the microcapsule wall.

In the invention, both the compound capable of forming cross-links by an acid and the radical-polymerizable compound can be used simultaneously, too. In this case, the compound capable of forming cross-links by an acid and the radical-polymerizable compound may be microencapsulated separately, or both of these compounds may be microencapsulated together.

Suitable average diameter of the microcapsules is from 0.01 to 3.0 μm, preferably from 0.05 to 2.0 μm, particularly preferably from 0.10 to 1.0 μm. When the average diameter of the microcapsules is within that range, satisfactory resolution and aging stability are achieved.

Those microcapsules may be united or needn't be united among themselves when they are heated. It is essential only that one of the ingredients enclosed in the microcapsules, which is oozing from the microcapsule surface or into the exterior of the microcapsules by heating, or an ingredient intruding into the microcapsule wall by heating causes chemical reaction by heat. Such an ingredient may react with a hydrophilic resin added or a low molecular weight compound added. On the other hand, different kinds of functional groups capable of thermally reacting with each other are imparted to at least two different kinds of microcapsules, respectively, and the resultant microcapsules are made to react with each other. Therefore, it is preferable from the viewpoint of image formation that the microcapsules are fused and united among themselves by heat, but it is not essential.

The suitable amount, on a solids basis, of microcapsules added to the image-forming layer is at least 50 mass %, preferably 70–98 mass %, of the total solids in the image forming layer. When the addition amount of microcapsules is within the aforesaid range, satisfactory image formation and press life can be achieved.

When the microcapsules are incorporated into the present image-forming layer, a solvent in which the compounds enclosed in the microcapsules can dissolve and the wall material can swell can be added to a dispersion medium of the microcapsules. By use of a solvent having such properties, it becomes possible to accelerate dispersion of the enclosed reactive group-containing compound to the outside of the microcapsules. Depending on the dispersion medium of the microcapsules and the microcapsule wall material, the wall thickness and the compound enclosed, such a solvent can be easily selected from many commercial solvents. In the case of water-dispersible microcapsules having cross-linked polyurea or polyurethane wall, for instance, monohydric alcohols, ethers, acetals, esters, ketones, polyhydric alcohols, amides, amines and fatty acids are suitable as the solvent for the foregoing purpose.

Examples of those solvents include methanol, ethanol, tertiarybutanol, n-propanol, tetrahydrofuran, methyl lactate, ethyl lactate, methyl ethyl ketone, propylene glycol monomethyl ether, ethylene glycol diethyl ether, ethylene glycol monomethyl ether, γ-butyrolactone, N,N-dimethylformamide and N,N-dimethylacetamide. However, solvents usable for the foregoing purpose should not be construed as being limited to these examples. Incidentally, those solvents can be used as mixtures of two or more thereof. Further, solvents which are insoluble in microcapsule-dispersing media but become soluble therein only when mixed with the solvents as recited above can be used, too.

The effective addition amount of such solvents, though depends on what materials are combined, is generally from 5 to 95 mass %, preferably from 10 to 90 mass %, far preferably from 15 to 85 mass %, of the coating solution.

(Light-to-Heat Converting Agent)

In the present image-forming layer, a light-to-heat converting agent having the function of converting light to heat is incorporated for the purpose of heightening the sensitivity. The light-to-heat converting agent incorporated may be any of materials capable of absorbing infrared rays, especially near infrared rays (with wavelengths of 700 to 2,000 nm), with examples including a wide variety of known pigments, dyes or coloring matters, and particulate metals.

Specifically, the pigments, dyes or coloring matters, and the particulate metals as disclosed in JP-A-2001-301350, JP-A-2002-137562 and *Nippon Insatsu Gakkai-Shi*, vol. 38, pp. 35–40 (2001) (entitled "New Imaging Materials 2. Near Infrared Ray Absorbing Dye"), can be used to advantage. As to the pigments and the particulate metals, known surface treatments can be given to them as needed.

More specifically, the dyes or the pigments suitable as the light-to-heat converting agent include the cyanine dyes, the polymethine dyes, the azomethine dyes, the squarylium dyes, the pyrylium and thiopyrylium-salt dyes, the dithiol-metal complexes and the phthalocyanine dyes as disclosed in U.S. Pat. Nos. 4,756,993 and 4,973,572, JP-A-10-268512m JP-A-11-235883, JP-B-5-13514, JP-B-5-19702, and JP-A-2001-347765. Of these dyes, the cyanine dyes, the squarylium dyes, the pyrylium-salt dyes and the phthalocyanine dyes are preferred over the others.

The pigments suitable as the light-to-heat converting agent include insoluble azo pigments, azo lake pigments, condensed azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, dyed lake pigments, azine pigments, nitroso pigments, nitro pigments, natural pigments, fluorescent pigments, inorganic pigments, and carbon black. Of these pigments, carbon black is preferred over the others.

Suitable examples of metal in a particulate state include Ag, Au, Cu, Sb, Ge and Pb. Of these metals, Ag, Au and Cu are preferred over the others.

The light-to-heat converting agent may be incorporated into the image-forming layer in a form that it is enclosed in the microcapsules or added to a hydrophilic medium outside the microcapsules. Examples of light-to-heat converting agents especially suitable in the invention are illustrated below. However, these examples should not be construed as limiting the scope of the invention. (IR-1) to (IR-12) are hydrophilic light-to-heat converting agents suitable for addition to hydrophilic media, and (IR-21) to (IR-30) are lipophilic light-to-heat converting agents suitable for containment in the microcapsules.

(IR-1)
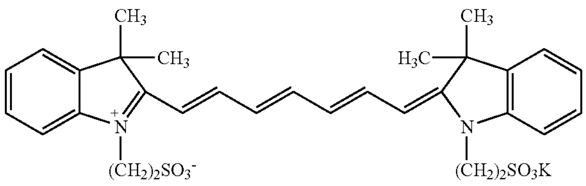
(IR-2)
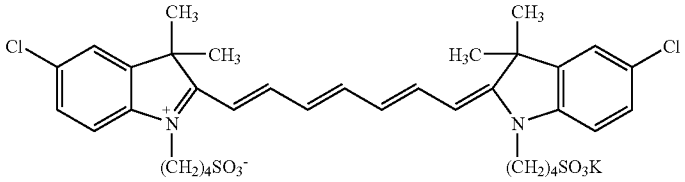
(IR-3)
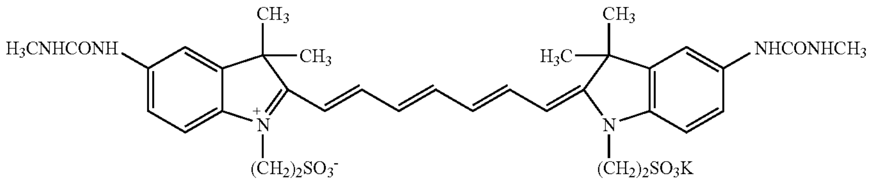
(IR-4)
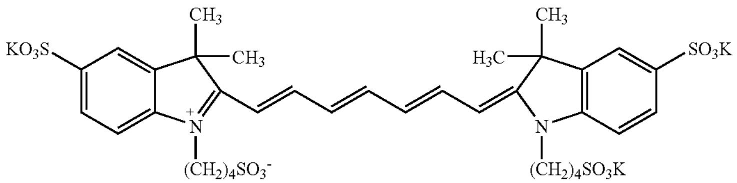
(IR-5)
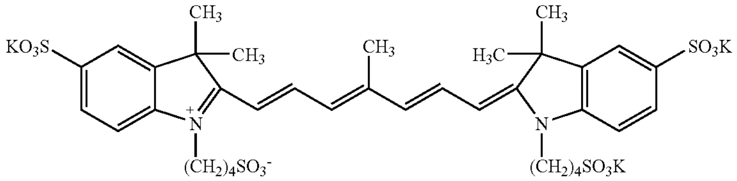
(IR-6)
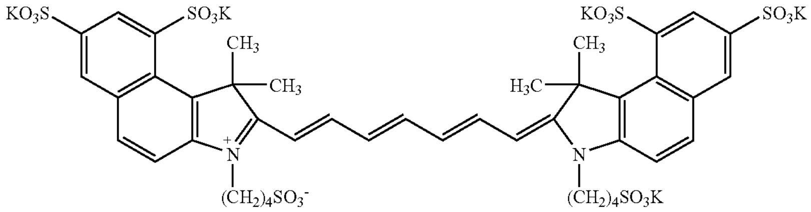
(IR-7)
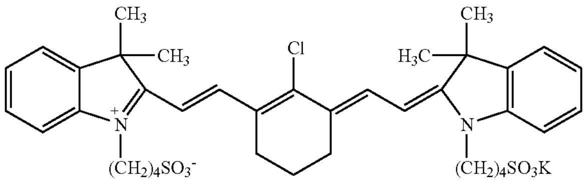
(IR-8)
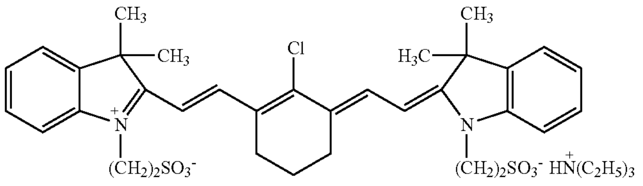

-continued
(IR-9)
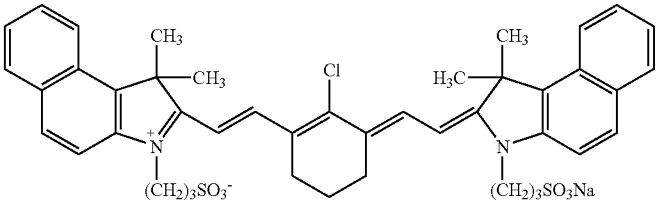
(IR-10)
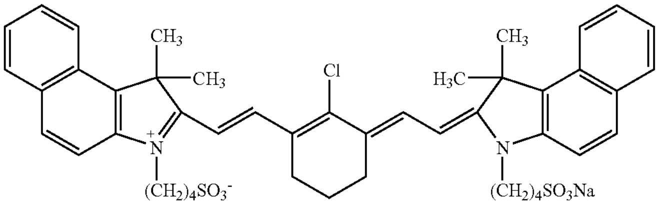
(IR-11)
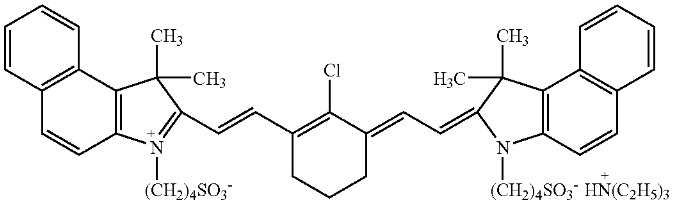
(IR-12)
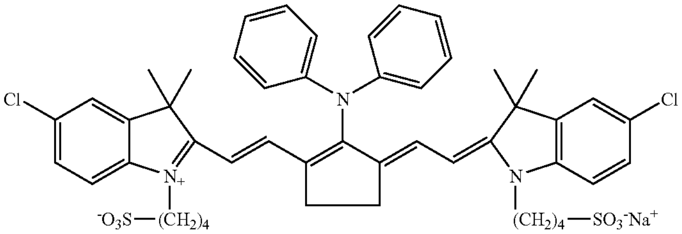
(IR-21)
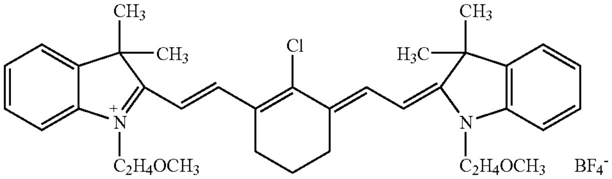
(IR-22)
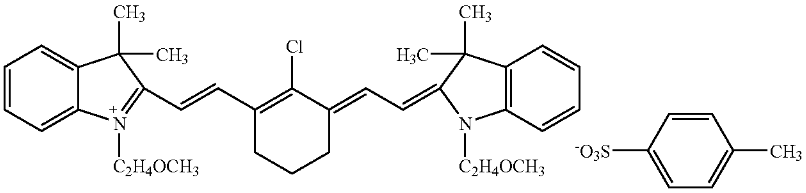
(IR-23)
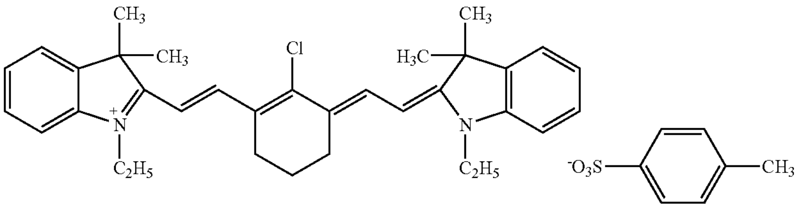

-continued
(IR-24)
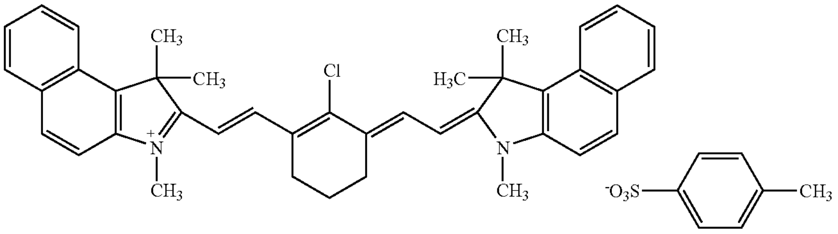
(IR-25)
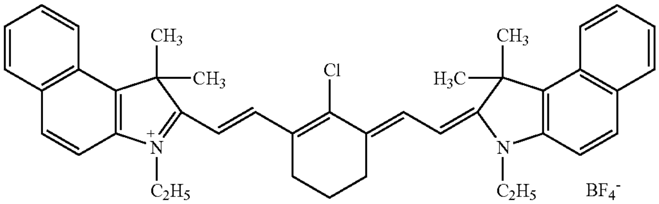
(IR-26)
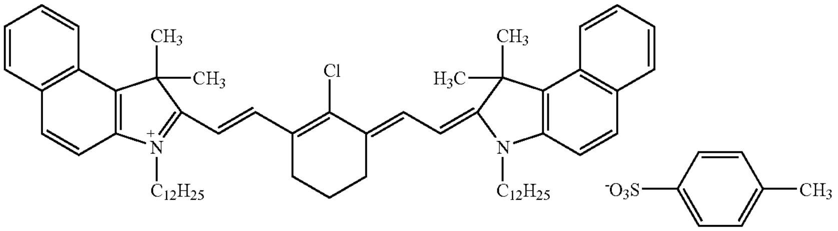
(IR-27)
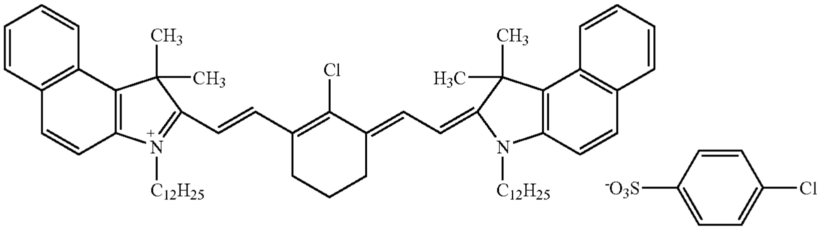
(IR-28)
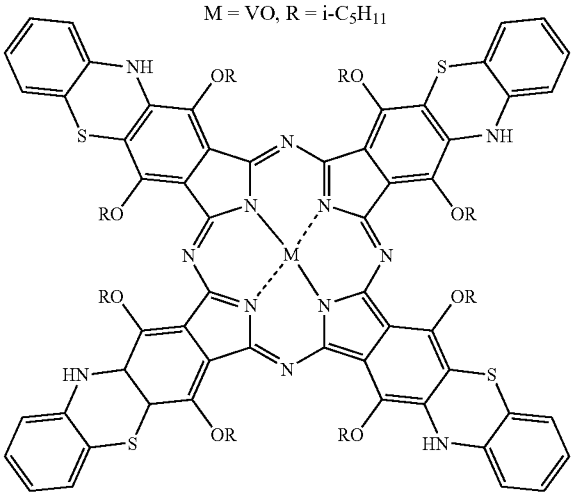

-continued (IR-29)

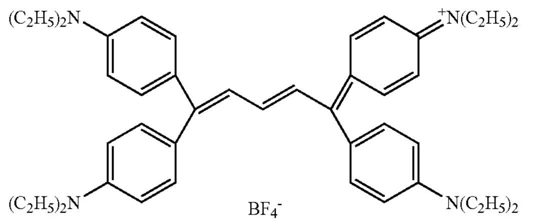

(IR-30)

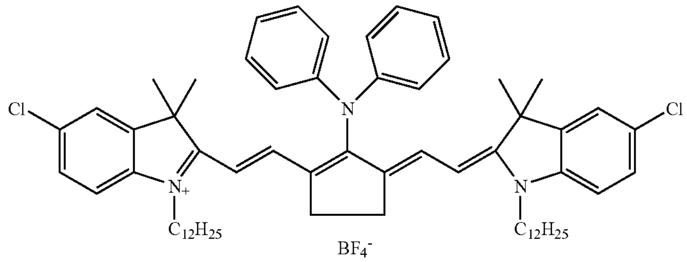

It is appropriate that the light-to-heat converting agent form 1 to 5.0 mass %, preferably 3 to 25 mass %, of the total solids in the image-forming layer. When the proportion of the light-to-heat converting agent is within such a range, satisfactory sensitivity is obtained without attended by impairment of film strength of the image-forming layer.

(Other Additives)

To the present image-forming layer, hydrophilic resin can be added for the purpose of improving on-press developability and film strength of the image-forming layer in itself. As the hydrophilic resin, resin having hydrophilic groups, such as hydroxyl groups, amino groups, carboxyl groups, phosphoric acid groups, sulfonic acid groups or amino groups, is suitable. Further, it is preferable that such hydrophilic resin has groups capable of reacting with the reactive groups of the lipophilic compound enclosed in the microcapsules, because the reaction of the groups with the reactive groups forms cross-links to result in enhancement of image strength and impression capacity. In the case where the lipophilic compound contains vinyloxy groups or epoxy groups, for instance, the resin containing hydroxyl groups, carboxyl groups, phosphoric acid groups or sulfonic acid groups is suitable as the hydrophilic resin. Of these resins, the hydrophilic resin having hydroxyl or carboxyl groups is preferred over the others.

Examples of such hydrophilic resin include gum arabic, casein, gelatin, starch derivatives, soya gum, hydroxypropyl cellulose, methyl cellulose, carboxymethyl cellulose and sodium salt thereof, cellulose acetate, sodium alginate, vinyl acetate-maleicacidcopolymers, styrene-maleicacidcopolymers, polyacrylic acids and salts thereof, homo- and copolymers of hydroxyethyl methacrylate, homo- and copolymers of hydroxyethyl acrylate, homo- and copolymers of hydroxypropyl methacrylate, homo- and copolymers of hydroxypropyl acrylate, homo- and copolymers of hydroxybutyl methacrylate, homo- and copolymers of hydroxybutyl acrylate, polyethylene glycols, hydroxypropylene polymers, polyvinyl alcohols, hydrolyzed polyvinyl acetate having a hydrolysis degree of at least 60 mass %, preferably at least 80 mass %, polyvinyl formal, polyvinyl pyrrolidone, homo- and copolymers of acrylamide, homo- and copolymers of N-methylolacrylamide, homo- and copolymers of 2-acrylamido-2-methyl-1-propanesulfonic acid, and homo- and copolymers of 2-methacryloyloxyethylphosphonic acid.

The suitable proportion of the hydrophilic resin added to the image-forming layer is 20 mass % or below, preferably 10 mass % or below.

Further, the hydrophilic resins as recited above may be used in a state that they are cross-linked to such an extent as to enable on-press development of unexposed areas. Examples of an agent for cross-linking those hydrophilic resins include aldehydes, such as glyoxal, melamine-formaldehyde resin and urea-formaldehyde resin; methylol compounds, such as N-methylolurea, N-methylolmelamine and methylolated polyamide resins; active vinyl compounds, such as divinylsulfone and bis(β-hydroxyethylsulfonic acid); epoxy compounds, such as epichlorohydrin, polyethylene glycol diglycidyl ether, polyamide-epichlorohydrin adduct, polyamine-epichlorohydrin adduct and polyamide-epichlorohydrin resin; ester compounds, such as monochloroacetic acid esters and thioglycolic acid esters; polycarboxylic acids, such as polyacrylic acid and methyl vinyl ether-maleic acid copolymer; inorganic cross-linking agents, such as boric acid, titanyl sulfate and Cu, Al, Sn, V and Cr salts; and modified polyamide-polyimide resins. In addition, cross-linking catalysts, such as ammonium chloride, silane coupling agents and titanate coupling agents, can be used in combination with the cross-linking agents as recited above.

The present image-forming layer can contain a reaction accelerator capable of initiating or accelerating the reaction with the thermally reactive groups as recited above. As the reaction accelerator generates an acid or radical, it can form a printing-out system by combination with a dye capable of discoloring by the acid or radical generated. Suitable examples of such a reaction accelerator include known acid precursors, acid generators and compounds referred to as thermal radical generators. Specifically, photoinitiators for photocationic polymerization, photoinitiators for photoradical polymerization, acid generators for forming printed-out images, and acid generators used in microresist can be used as the reaction accelerators.

More specifically, the organic halogen compounds as typified by trihalomethyl-substituted heterocyclic compounds, the compounds capable of generating sulfonic acid through photolysis as typified by iminosulfonate, disulfone compounds, and onium salts (e.g., iodonium salts, diazonium salts, sulfonium salts), which are disclosed in JP-A-2002-29162, JP-A-2002-46361 and JP-A-2002-137562, can be used as the reaction accelerators. Further, compounds obtained by introducing groups or compounds capable of generating those acids or radicals into main or side chains of polymers can also be used. Examples of compounds usable as the reaction accelerators are illustrated below, but the reaction accelerators usable in the invention should not be construed as being limited to these examples.

(A-1)

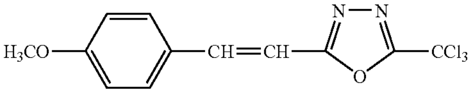

(A-2)

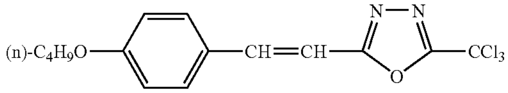

(A-3)

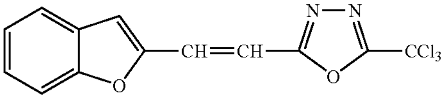

(A-4)

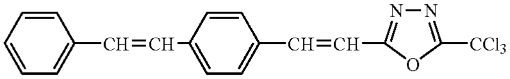

(A-5)

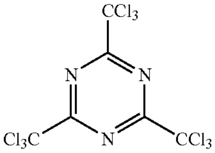

(A-6)

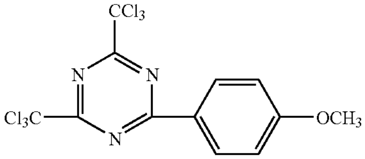

(A-7)

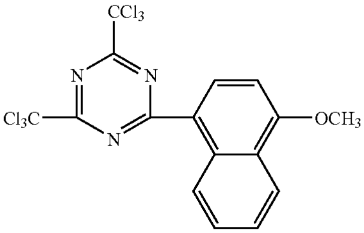

(A-8)

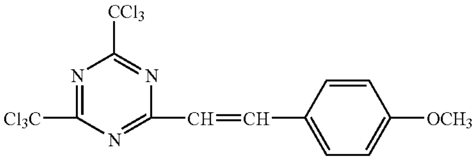

(A-9)

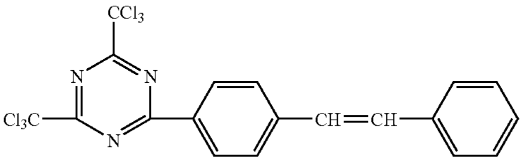

(A-10)

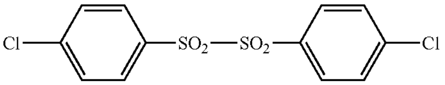

(A-11)

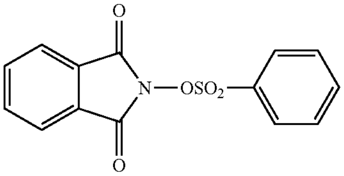

(AI-1)

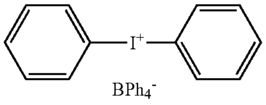

(AI-2)

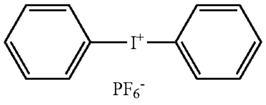

(AI-3)

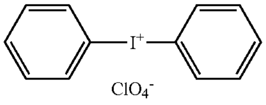

(AI-4)

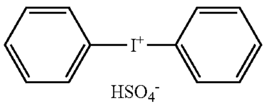

(AI-5)

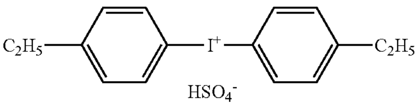

-continued
(AI-6)
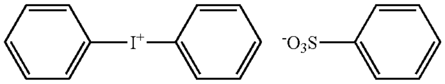
(AI-7)
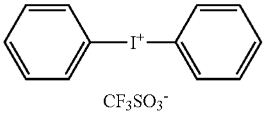
(AI-8)
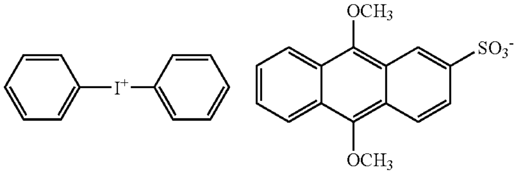
(AI-9)
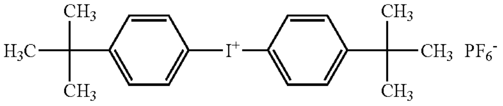
(AI-10)
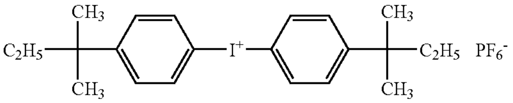
(AI-11)
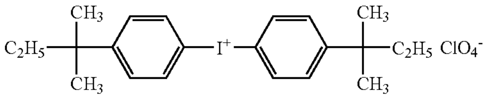
(AI-12)
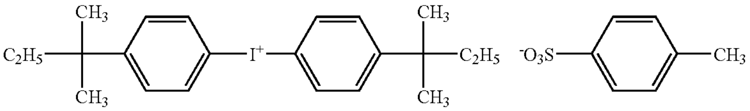
(AI-12)
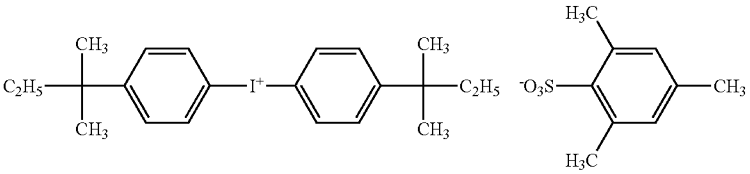
(AI-14)
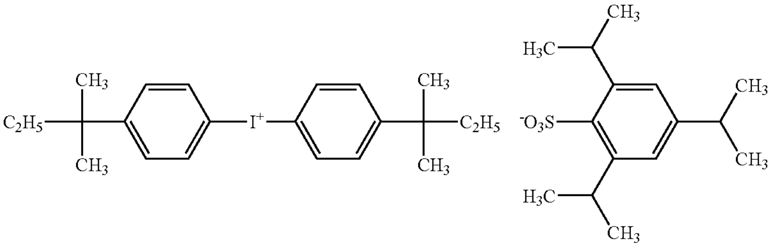
(AI-15)
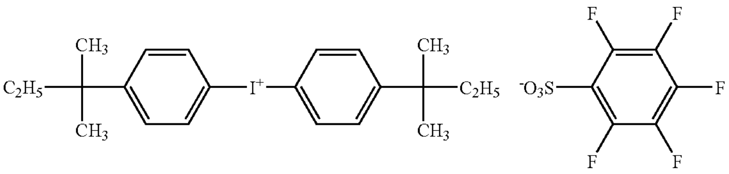
(AI-16)
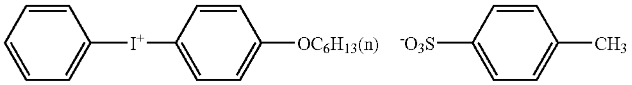
(AI-17)
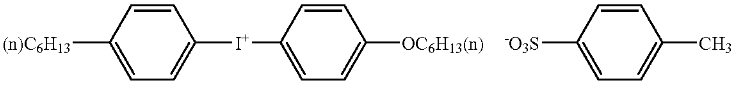
(AN-1)
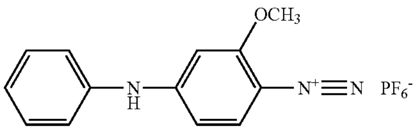
(AN-2)
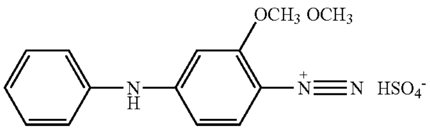

-continued
(AN-3)
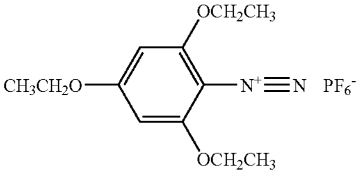
(AN-4)
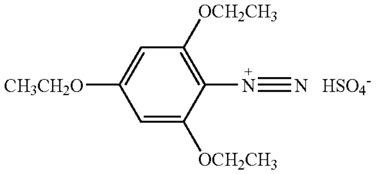
(AN-5)
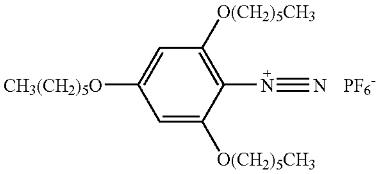
(AN-6)
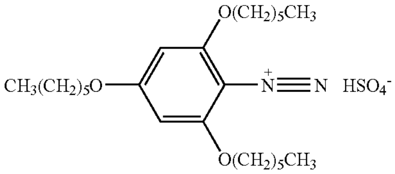
(AN-7)
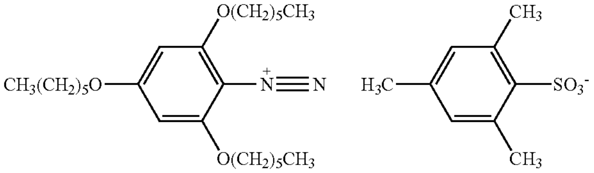
(AN-8)
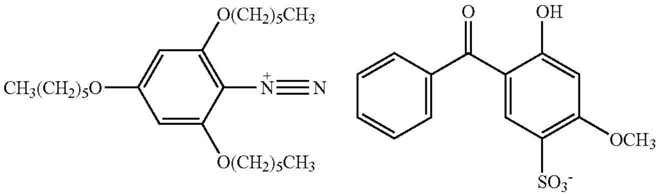
(AS-1)
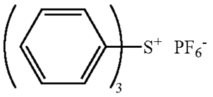
(AS-2)
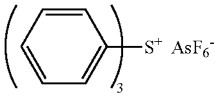
(AS-3)
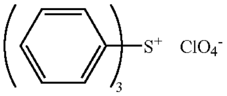
(AS-4)
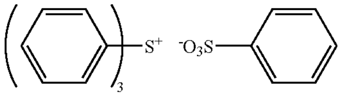
(AS-5)
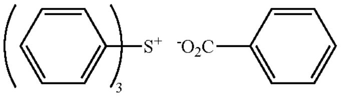
(AS-6)
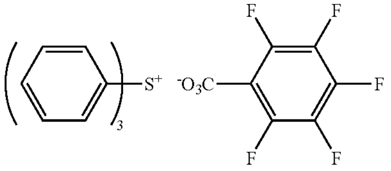
(AS-7)
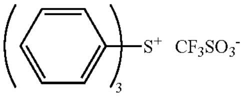
(AS-8)
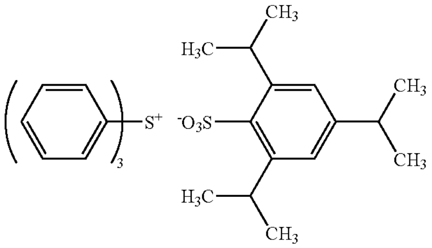
(AS-9)
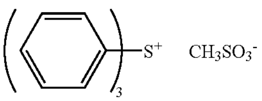
(AS-10)
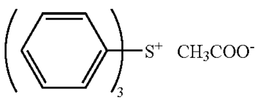

-continued (AS-11)

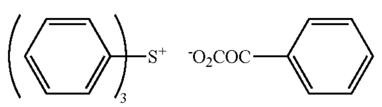

(AS-12)

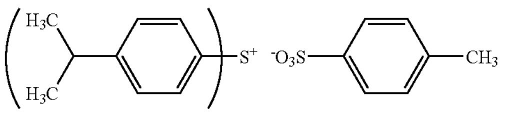

The reaction accelerators illustrated above can be used as combinations of two or more thereof. In incorporating such a reaction accelerator into the image-forming layer, it may be added directly to a coating composition for the image-forming layer or in a form that it is enclosed in the microcapsules. The suitable content of the reaction accelerator(s) in the image-forming layer is from 0.01 to 20 mass %, preferably from 0.1 to 10 mass %, of the total solids in the image-forming layer, When the content is within such a range, satisfactory reaction initiating or accelerating effect can be obtained without attended by impairment of on-press developability.

To the present image-forming layer, compounds capable of discoloring by acids or radicals can be added for the purpose of forming printed-out images. As those compounds, a wide variety of dyes, such as diphenylmethane dyes, triphenylmethane dyes, thiazine dyes, oxazine dyes, xanthene dyes, anthraquinone dyes, iminoquinone dyes, azo dyes and azomethine dyes, can be used effectively.

Examples of those dyes include Brilliant Green, Ethyl Violet, Methyl Green, Crystal Violet, Basic Fuchsine, Methyl Violet 2B, Quinaldine Red, Rose Bengale, Metanil Yellow, Thymolsulfophthalein, Xylenol Blue, Methyl Orange, Para Methyl Red, Congo Red, Benzopurpurine 4B, α-Naphthyl Red, Nile Blue A, Methyl Violet, Malachite Green, Para Fuchsine, Victoria Pure Blue BOH (produced by Hodogaya Chemical Co., Ltd.), Oil Blue #603 (produced by Orient Chemical Industries, Ltd.), Oil Pink #312 (produced by Orient Chemical Industries, Ltd.), Oil Red 5B (produced by Orient Chemical Industries, Ltd.), Oil Scarlet #308 (produced by Orient Chemical Industries, Ltd.), Oil Red OG (produced by Orient Chemical Industries, Ltd.), Oil Red RR (produced by Orient Chemical Industries, Ltd.), Oil Green #502 (produced by Orient Chemical Industries, Ltd.), Spiron Red BEH Special (produced by Hodogaya Chemical Co., Ltd.), m-cresol purple, Cresol Red, Rhodamine B, Rhodamine 6G, Sulforhodamine B, Auramine, 4-p-diethylaminophenyliminonaphthoquinone, 2-carboxyanilino-4-p-diethylaminophenyliminonaphthoquinone, 2-carboxystearylamino-4-p-N,N-bis(hydroxyethyl)aminophenyliminonaphthoquinone, 1-phenyl-3-methyl-4-p-diethylaminophenylimino-5-pyrazolone, and 1-β-naphthyl-4-p-diethylaminophenylimino-5-pyrazolone. In addition to the dyes recited above, leuco dyes such as p', p"-hexamethyltriaminotriphenylmethane (Leuco Crystal Violet) and Pergascript Blue SRE (produced by Ciba-Geigy AG) can be used effectively.

Further, leuco dyes known as materials for heat-sensitive paper and pressure-sensitive paper are also suitable. Examples of such leuco dyes include Crystal Violet lactone, Malachite Green lactone, benzoyl Leucomethylene Blue, 2-(N-phenyl-N-methylamino)-6-(N-p-tolyl-N-ethyl)aminofluoran, 2-anilino-3-methyl-6-(N-ethyl-p-toluidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N,N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-aminofluoran, 3-(N,N-diethylamino)-7-4-chloroanilino)fluoran, 3-(N,N-diethylamino)-7-chlorofluoran, 3-(N,N-diethylamino)-7-benzylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-piperidino-6-methyl-7-anilinofluoran, 3-pyrrolidino-6-methyl-7-anilinofluoran, 3,3-bis (1-ethyl-2-methylindole-3-yl)phthalide, 3,3-bis (1-n-butyl-2-methylindole-3-yl)phthalide, 3,3-bis (p-dimethylaminophenyl)-6-dimethylaminophthalide, 3-(4-diethylamino-2-ethoxyphenyl)-3-(1-ethyl-2-methylindol e-3-yl)-4-zaphthalide, and 3-(4-diethylaminophenyl)-3-(1-ethyl-2-methylindole-3-yl)-phthalide.

The suitable addition amount of dyes capable of discoloring by acids or radicals is from 0.01 to 10 mass % of the total solids in the image-forming layer.

Furthermore, various compounds other than those recited above may be added to the present image-forming layer, if needed. With the intention of further improving the impression capacity, for instance, polyfunctional monomers can be added to the image-forming layer so that they are situated on the outside of the microcapsules. As such polyfunctional monomers, those recited as examples of monomers which can be enclosed in the microcapsules can be used. Of these monomers, trimethylolpropane acrylate and pentaerythritol triacrylate are preferred over the others.

For the purpose of inhibiting undesired thermal polymerization of ethylenic unsaturated compounds during the preparation or storage of a coating solution for the present image-forming layer, it is preferable to add a small amount of thermal polymerization inhibitor to the, coating solution. Suitable examples of a thermal polymerization inhibitor include hydroquinone, p-methoxyphenol, di-t-butyl-p-cresol, pyrogallol, t-butylcatechol, benzoquinone, 4,4'-thobis(3-methyl-6-t-butylphenol), 2,2'-methylenebis(4-methyl-6-t-butylphenol) and aluminum salt of N-nitroso-N-phenylhydroxylamine. The amount of a thermal polymerization inhibitor added is from 0.01 to 5% of the total weight of the coating composition.

When there is also a need to prevent polymerization inhibition by oxygen, higher fatty acids or their derivatives, such as behenic acid or behenic acid amide, can be added to the coating solution and localized to the surface of the image-forming layer in the process of drying after the coating. The suitable amount of the higher fatty acid or its derivative added is from 0.01 to about 10 mass % of the total solids in the image-forming layer.

In addition, inorganic fine grains may be added to the present image-forming layer. Suitable examples thereof include silica, alumina, magnesium oxide, titanium oxide, magnesium carbonate, calcium alginate and mixtures of two or more thereof. These fine grains, even if they don't have light-to-heat converting properties, can serve the purposes of heightening the film strength and enhancing interfacial adhesion by imparting roughness to the layer surface.

The suitable average size of such inorganic fine particles is from 5 nm to 10 μm, preferably from 10 nm to 1 μm. When the average grain size is within such a range, those inorganic fine grains, together with fine particles of resin and particulate metal as the light-to-heat converting agent, can be dispersed stably in hydrophilic resin, thereby retaining the film strength of the image-forming layer to a sufficient degree and enabling formation of highly hydrophilic, scum-resistant non-image areas.

Those inorganic fine particles are easy to get as commercial products, such as colloidal silica dispersions. The suitable content of inorganic fine particles in the image-forming layer is not greater than 20 mass %, preferably at most 10 mass %, of the total solids in the image-forming layer.

Further, the nonionic, anionic, cationic, amphoteric and fluorine-containing surfactants as disclosed in JP-A-2-195356, JP-A-59-121044, JP-A-4-13149 and Japanese Patent Application No. 2001-169731 can be added to the present image-forming layer for the purposes of improving dispersion stability of the image-forming layer, platemaking and printing capabilities, and coatability. The suitable amount of those surfactants added is from 0.005 to 1 mass % of the total solids in the image-forming layer.

Furthermore, plasticizers can be added to the present image-forming layer for imparting flexibility to the coating layer, if needed. For instance, polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate can be used as the plasticizers.

The ingredients recited above are dispersed or dissolved in a solvent as required to prepare a coating composition, and the composition is coated to form the present image-forming layer. Examples of a solvent usable herein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propylacetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water. However, these examples should not be construed as limiting the solvents used in the invention. Those solvents are used alone or as mixtures of two or more thereof. The suitable solids concentration in the coating composition is from 1 to 50 mass %.

The suitable coverage of the image-forming layer (the amount of solid matter) obtained on a support after coating and drying operations, though depends on the uses to which the image-forming layer is put, is generally from 0.5 to 5.0 $g/m^2$. When the coverage is below this range, the apparent sensitivity becomes high, but the film properties of the image-forming layer performing the function of recording images are degraded. The coating operation can be performed using various methods. Examples of a coating method usable herein include bar coater coating, spin coating, spray coating, curtain coating, dip coating, air-knife coating, blade coating and roll coating.

<Support>

The support usable in the invention is a dimensionally stable sheet material, with examples including paper, plastic-laminated paper (such as paper laminated with polyethylene, polypropylene or polystyrene), metal sheets (such as aluminum, zinc and copper sheets), plastic films (such as cellulose diacetate, cellulose triacetate, cellulose propionate, cellulose butyrate, cellulose acetate butyrate, cellulose nitrate, polyester, polyethylene terephthalate, polyethylene, polystyrene, polypropylene, polycarbonate and polyvinyl acetal films), and paper or plastic films on which any of the metals as recited above have been laminated or vacuum-deposited. Of these materials, a polyester film or an aluminum sheet is preferred over the others.

The aluminum sheet is a pure aluminum sheet, an aluminum alloy sheet containing aluminum as a major component and trace amounts of foreign elements, or a thin film of pure aluminum or an aluminum alloy that has been laminated with plastic. Examples of foreign metals containable in aluminum alloys. include silicon, iron, manganese, copper, magnesium, chromium, zinc, bismuth, nickel and titanium. The content of those foreign metals in aluminum alloy is up to 10 mass %. The aluminum sheet used in the invention may be an aluminum sheet from an aluminum ingot made by direct chill casting, or it may be an aluminum sheet from an aluminum in got made by continuous casting. In the invention, however, aluminum sheets from any of hitherto known and widely used materials can also be utilized as appropriate.

The thickness of the substrate as recited above is from 0.05 to 0.6 mm, preferably from 0.1 to 0.4 mm, particularly preferably from 0.15 to 0.3 mm.

Before using such an aluminum sheet, the aluminum sheet is subjected to surface treatments, such as surface-roughening treatment and anodic oxidation treatment. These treatments not only can render the aluminum sheet surface highly hydrophilic, but also can make it easy to ensure sufficient adhesion to the image-forming layer.

The surface-roughening treatment of an aluminum sheet can be carried out using various methods. For instance, a method of roughening the aluminum sheet surface mechanically, a method of dissolving and roughening the surface electrochemically, or a method of selectively dissolving the surface through chemical action can be adopted. As the mechanical surface-roughening method, known methods including a ball graining method, a brush graining method, a blast graining method and a buff graining method can be used. As the chemical surface-roughening method, the method disclosed in JP-A-54-31187 is suitable, wherein an aluminum sheet is immersed into a saturated solution of the aluminum salt of a mineral acid. As to the electrochemical surface-roughening method, there is a method of roughening the aluminum sheet surface in an electrolytic solution containing an acid, such as hydrochloric acid or nitric acid, by passing AC or DC current through the electrolytic solution. In addition, as disclosed in JP-A-54-63902, the electrolytic surface-roughening method using a mixed acid can also be utilized. It is appropriate that the surface-roughening treatment according to the methods as mentioned above be performed to an extent that the aluminum sheet surface comes to have a center-line average roughness (Ra) of 0.2 to 1.0 μm.

The thus surface-roughened aluminum sheet is subjected to alkali etching treatment with an aqueous solution of potassium hydroxide or sodium hydroxide, and further to neutralizing treatment, if needed, and then to anodic oxidation treatment, if desired for enhancing abrasion resistance of the surface.

For the anodic oxidation treatment of an aluminum sheet, various electrolytes capable of forming porous film of oxide can be used. In general, sulfuric acid, hydrochloric acid, oxalic acid, chromic acid and mixtures of two or more thereof can be used as the electrolytes. The suitable electrolyte concentration can be determined properly depending on the kind of an electrolyte used. Conditions for anodic oxidation treatment vary with electrolytes used, so they cannot be specified sweepingly. In general, however, it is appropriate that the concentration of an electrolytic solution be from 1 to 80 weight %, the electrolytic solution temperature be from 5 to 70° C., the current density be from 5 to 60 amperes/$dm^2$, the voltage be from 1 to 100 V, and the electrolysis time be from 10 sec. to 5 min. The suitable amount of the oxidized film formed is from 1.0 to 5.0 g/$m^2$, particularly from 1.5 to 4.0 g/$m^2$.

As the support used in the invention, the substrate that has undergone the foregoing surface treatments and come to have an oxide film by anodic oxidation may be used as it is. However, with the intention of further improving adhesion to the upper layer, water wettability, soil resistance and thermal insulation, such a substrate can further undergo treatment chosen appropriately from the treatment for enlarging or sealing micropores of the oxide film formed by anodic oxidation or the treatment for imparting water wettability to the surface by immersion into an aqueous solution of hydrophilic compounds as disclosed in JP-A-2001-253181 and JP-A-2001-322365.

Examples of a hydrophilic compound suitable for the water-wettability imparting treatment include polyvinyl phosphonic acid, compounds having sulfonic acid groups, saccharide compounds, citric acid, alkali metal silicates, potassium fluorozirconate, and phosphates/inorganic fluorine compounds.

When a support whose surface has insufficient water wettability, such as polyester films, is used for the present support, it is appropriate that the support surface be rendered hydrophilic by coating thereon a hydrophilic layer. As the hydrophilic layer, the hydrophilic layer as disclosed in JP-A-2001-199175 is suitable, which is formed by application of a coating composition containing colloidal oxide or hydroxide of at least one element selected from the group consisting of beryllium, magnesium, aluminum, silicon, titanium, boron, germanium, tin, zirconium, iron, vanadium, antimony and transition metals. In particular, the hydrophilic layer formed by application of a coating composition containing colloidal silicon oxide or hydroxide is preferable.

Before coating the present image-forming layer, the inorganic subbing layer disclosed in JP-A-2001-322365, specifically the inorganic subbing layer of a water-soluble metal salt, such as zinc borate, or the organic subbing layer containing carboxymethyl cellulose, dextrin or polyacrylic acid can be provided. Additionally, such a subbing layer can contain an infrared absorbing dye as recited hereinbefore.

<Overcoat Layer>

In the present heat-sensitive lithographic printing plate, an overcoat layer containing the water-soluble resin disclosed in JP-A-2001-162961, such as gum arabic, polyacrylic acid or a cellulose derivative, can be provided on the image-forming layer for the purpose of protecting the hydrophilic image-forming layer surface from contamination with lipophilic substances during the storage and fingerprint soil by contact with fingers at the time of handling.

On the other hand, a hydrophobic overcoat layer greater in contact angle of water (contact angle of water drop in the air) than the hydrophilic image-forming layer when the contact angle is measured with respect to a water drop put on the layer surface is also suitable in the invention.

Examples of an organic high molecular compound usable for the hydrophobic overcoat layer include polybutene, polybutadiene, saturated polyester resin, unsaturated polyester resin, nylon, polyurethane, polyurea, polyimide, polysiloxane, polycarbonate, epoxy resin, phenoxy resin, chlorinated polyethylene, alkylphenol-formaldehyde condensation resin, acetal resin, polyvinyl chloride, polyvinylidene chloride, polystyrene, acrylic resin, and resins prepared by copolymerizing some of constituent monomers of the resins recited above.

To the overcoat layer, a light-to-heat converting agent can be added for the purpose of increasing the sensitivity. Further, in the case of an overcoat layer formed from an aqueous coating solution, nonionic surfactants can be mainly added to the aqueous coating solution for the purpose of ensuring the coating uniformity; while, in the case of a hydrophobic overcoat layer, fluorine-containing surfactants can be added for the foregoing purpose. Furthermore, for the purpose of preventing stacked plates from sticking to each other upon storage, the overcoat layer can contain the compound having either fluorine or silicon atom as disclosed in JP-A-2001-341448.

The suitable thickness of the present overcoat layer is from 0.1 to 4.0 μm, preferably from 0.1 to 1.0 μm. When the thickness is within such a range, the overcoat layer can prevent contamination of the image-forming layer by lipophilic substances without loss of its on-press eliminability.

<Platemaking and Printing>

In the present heat-sensitive lithographic printing plate, images (latent images) are formed by heat prior to printing operations. More specifically, image formation is carried out by direct imagewise recording with a thermal recording head, scanning exposure using infrared laser, high illumination intensity flash exposure using a xenon discharge lamp, or exposure using an infrared lamp. Of these exposure methods, exposure methods using solid high-power infrared laser devices, such as semiconductor laser devices emitting infrared rays with wavelengths of 700 to 1,200 nm and YAG laser, are preferably adopted.

The present heat-sensitive lithographic printing plate in which latent images have been formed can be mounted in a printing press without undergoing further processing. Upon commencement of printing with ink and dampening water, the unexposed areas of the image-forming layer are removed, and the ink adheres to the exposed areas and printing start to be performed.

Alternatively, it is possible to use a printing system in which the present heat-sensitive lithographic printing plate is mounted on the plate cylinder of a printing press, and then exposed to laser installed in the press, and further subjected to on-press development, followed by printing.

EXAMPLES

Now, the invention is illustrated in more detail by reference to the following examples. However, these examples should not be construed as limiting the scope of the invention in any way.

<Synthesis of Microcapsules (1)>

An oil-phase composition was prepared by dissolving 40 g of a microcapsule wall material, trimethylolpropane-xylylene diisocyanate adduct (Takenate D-110N, a product of Mitsui Takeda Chemicals, Inc.), 13 g of bis (vinyloxyethyl) ether of bisphenol A, 5 g of a light-to-heat converting agent (IR-26, illustrated hereinbefore in the specification), 2 g of Crystal Violet lactone (produced by Tokyo Kasei Kogyo Co., Ltd.) and 0.1 g of Pionin A41C (a product of Takemoto Oil & Fat Co., Ltd.) into 60 g of ethyl acetate. As a water-phase composition, 120 g of a 4% water solution of polyvinyl alcohol (PVA205, a product of Kuraray Co., Ltd.) was prepared. The oil-phase composition and the water-phase composition were emulsified at 10,000 rpm for 10 minutes by means of a homogenizer. The emulsion thus prepared was mixed with 40 g of water and stirred for 30 minutes at room temperature, and further stirred for 3 hours at 40° C. The thus obtained solution of microcapsules had a solids concentration of 25 mass % and an average particle diameter of 0.4 μm.

<Synthesis of Microcapsules (2)>

An oil-phase composition was prepared by dissolving 40 g of a microcapsule wall material, trimethylolpropane-xylylene diisocyanate adduct (Takenate D-110N, a product of Mitsui Takeda Chemicals, Inc.), 13 g of dipentaerythritol pentaacrylate (SR399A, a product of Nippon Kayaku Co., Ltd.), 5 g of a light-to-heat converting agent (IR-26, illustrated hereinbefore in the specification), 2 g of 3-(N,N-diethylamino)-6-methyl-7-anilinofluoran (ODB, a product of Yamamoto Chemicals Inc.) and 0.1 g of Pionin A41C (a product of Takemoto Oil & Fat Co., Ltd.) into 60 g of ethyl acetate. As a water-phase composition, 120 g of a 4% water solution of polyvinyl alcohol (PVA205, a product of Kuraray Co., Ltd.) was prepared. The oil-phase composition and the water-phase composition were emulsified at 10,000 rpm for 10 minutes by means of a homogenizer. The emulsion thus prepared was mixed with 40 g of water and stirred for 30 minutes at room temperature, and further stirred for 3 hours at 40° C. The thus obtained solution of microcapsules had a solids concentration of 25 mass % and an average particle diameter of 0.35 μm.

<Synthesis of Microcapsules (3)>

An oil-phase composition was prepared by dissolving 10 g of a microcapsule wall material, trimethylolpropane-xylylene diisocyanate adduct (Takenate D-110N, a product of Mitsui Takeda Chemicals, Inc.), 5.6 g of pentaerythritol triacrylate (SR444, a product of Nippon Kayaku Co., Ltd.), 0.3 g of a reaction accelerator (AS-1, illustrated hereinbefore in the specification), 0.15 g of a light-to-heat converting agent (IR-30, illustrated hereinbefore in the specification), 0.12 g of Pionin A41C (a product of Takemoto Oil & Fat Co., Ltd.) into 17 g of ethyl acetate. As a water-phase composition, 37.5 g of a 4% water solution of polyvinyl alcohol (PVA205, a product of Kuraray Co., Ltd.) was prepared. The oil-phase composition and the water-phase composition were emulsified at 10,000 rpm for 10 minutes by means of a homogenizer. The emulsion thus prepared was mixed with 25 g of water and stirred for 30 minutes at room temperature, and further stirred for 3 hours at 40° C. The thus obtained solution of microcapsules had a solids concentration of 20 mass % and an average particle diameter of 0.25 μm.

<Preparation of Aluminum Support>

The surface of a 0.24 mm-thick rolled sheet of JISA 1050 aluminum material containing 99.5 mass % aluminum, 0.01 mass % copper, 0.03 mass % titanium, 0.3 mass % iron and 0.1 mass % silicon was grained using a rotating brush of nylon (6,10-nylon) and a 20 mass % of aqueous suspension of 400-mesh pumice stone (produced by KCM Corporation), and then washed thoroughly with water. This sheet was immersed in a 15 mass % sodium hydroxide solution (containing 4.5 mass % aluminum) and etched till the amount of aluminum dissolved reached 5 $g/m^2$, followed by wash with running water. Further, the resulting sheet was neutralized with a 1 mass % nitric acid, and further subjected to electrolytic surface-roughening treatment wherein a 0.7 mass % aqueous solution of nitric acid (containing 0.5 mass % aluminum) was used as an electrolyte and the anode electricity quantity of 160 $Coulomb/dm^2$ was supplied using alternating voltage of rectangular-wave form having the anode voltage of 10.5 volt and the cathode voltage of 9.3 volt (current ratio r=0.90, the current wave form disclosed in JP-B-58-5796). After wash, the aluminum sheet was immersed in a 10 mass % of aqueous sodium hydroxide solution kept at 35° C. and etched till the amount of aluminum dissolved reached 1 $g/m^2$, and further washed. Then, the aluminum sheet was desmutted by immersion in a 50° C., 30 mass % aqueous solution of sulfuric acid, and further washed.

Furthermore, the aluminum sheet was anodized in a 30° C., 20 mass % aqueous $H_2SO_4$ solution (containing 0.8 mass % aluminum) under a current density of 13 $A/dm^2$ till the anodic coating had a coverage of 2.7 $g/m^2$. After wash, the aluminum sheet was immersed in a 70° C., 0.2 mass % aqueous solution of sodium silicate for 30 seconds, washed and then dried to prepare an aluminum support.

Example 1

A heat-sensitive lithographic printing plate was prepared by coating on the aluminum support a coating solution (1) having the following composition by means of a bar coater, and then drying the coating for 60 seconds in a 70° C. oven, thereby forming an image-forming layer having a dry coverage of 0.8 $g/m^2$.

| Coating Solution (1) for Image-forming Layer: | |
|---|---|
| Water | 100 g |
| Microcapsules (1) (on a solids basis) | 5 g |
| Water-soluble reactive compound [1,4-butanediol diglycidyl ether (produced by Tokyo Kasei Kogyo Co., Ltd.) | 0.5 g |
| Reaction accelerator (AI-7, illustrated hereinbefore) | 0.5 g |
| Fluorine-containing surfactant (Megafac F-171, a product of Dainippon Ink & Chemicals, Incorporated). | 0.05 g |

The thus obtained heat-sensitive lithographic printing plate was exposed by using a Trendsetter 3244VX (made by CREO CO.) equipped with a water-cooled 40-watt infrared semiconductor laser under conditions that the output was 17 watts, the number of revolutions of the exterior drum was 150 rpm, the energy at the plate surface was 200 $mJ/m^2$ and the resolution was 2,400 dpi. Thereafter, the printing plate was mounted on the cylinder of a printing press SOR-M (made by Heidelberg A. G.) without undergoing any development. Thereto, a fountain solution constituted of EU-3 (an etching solution produced-by Fuji Photo Film Co., Ltd.), water and isopropyl alcohol (at a ratio of 1 to 89 to 10 by volume) was supplied, and then Indian ink, GEOS-G (produced by Dainippon Ink & Chemicals, Incorporated), was supplied, and further sheets of paper were fed successively, thereby entering into printing. Therein, on-press development was achieved without any problems, and printing was enabled. As a result of quality evaluation of the tenth-printed sheet by means of a 20× loupe, it was found that no scum developed and the densities of filled-in image areas were extremely consistent. When printing was further continued, at least 20,000 sheets of good-quality prints having neither fine-line dropouts, nor fine-character dropouts, nor unevenness in densities off filled-in image areas were obtained.

Example 2

A heat-sensitive lithographic printing plate was prepared in the same manner as in Example 1, except that the image-forming layer was formed using a coating solution (2) having the following composition in place of the coating solution (1).

| Coating Solution (2) for Image-forming Layer: | |
|---|---|
| Water | 100 g |
| Microcapsules (2) (on a solids basis) | 5 g |
| Water-soluble reactive compound [ethoxidized trimethylolpropane triacrylate (containing 15 moles of EO added and having molecular weight of 1,000, SR9035 produced by Nippon Kayaku Co., Ltd.) | 0.5 g |
| Acid precursor (As-10, illustrated hereinbefore) | 0.5 g |
| Fluorine-containing surfactant (Megafac F-171, a product of Dainippon Ink & Chemicals, Incorporated). | 0.05 g |

When the thus prepared heat-sensitive lithographic printing plate was subjected to imagewise exposure and printing in the same manner as in Example 1, on-press development was achieved without any problems, and printing was enabled. As a result of quality evaluation of the tenth-printed sheet by means of a 20× loupe, it was found that no scum developed and the densities of filled-in image areas were extremely consistent. When printing was further continued, at least 20,000 sheets of good-quality prints having neither fine-line dropouts, nor fine-character dropouts, nor unevenness in densities of filled-in image areas were obtained.

Examples 3 to 5

Heat-sensitive lithographic printing plates were prepared in the same manner as in Example 1, except that 0.5 g of 1,4-butanediol diglycidyl ether used as the water-soluble reactive compound in the coating solution (1) of Example 1 was replaced by 0.3 g of polyethylene glycol diglydicyl ether having molecular weight of about 300 (Epolite 200E, produced by KyoueiSha Yushi Kagaku Kogyo K.K.) in Example 3, 0.3 g of trimethylolpropane (EO)n triacrylate (Photomer 4155, produced by San Nopco Limited) in Example 4 and 0.5 g of tetraethylene glycol divinyl ether in Example 5, respectively. Then, the thus prepared heat-sensitive lithographic printing plates were each subjected to imagewise exposure and printing in the same manner as in Example 1. Therein, each of the printing plates was developed on the printing press without any problems, and enabled printing. When quality evaluation of the tenth sheet printed from each printing plate was made by means of a 20× loupe, it was found that no scum developed and the densities of filled-in image areas were extremely consistent. By further continuation of printing, each of the printing plates delivered at least 20,000 sheets of good-quality prints having neither fine-line dropouts, nor fine-character dropouts, nor unevenness in densities of filled-in image areas.

Examples 6 to 11

Heat-sensitive lithographic printing plates were prepared in the same manner as in Example 2, except that the ethoxidized trimethylolpropane triacrylate used as the water-soluble reactive compound in the coating solution (2) of Example 2 was replaced by the compounds shown in Table 1, respectively. Then, the thus prepared heat-sensitive lithographic printing plates were each subjected to imagewise exposure and printing in the same manner as in Example 1. Therein, each of the printing plates was developed on the printing press without any problems, and enabled printing. When quality evaluation of the tenth sheet printed from each plate was made by means of a 20× loupe, it was found that no scum developed and the densities of filled-in image areas were extremely consistent. By further continuation of printing, each of the printing plates delivered at least 20,000 sheets of good-quality prints having neither fine-line dropouts, nor fine-character dropouts, nor unevenness in densities of filled-in image areas.

TABLE 1

Water-soluble Reactive Compounds used in Examples 6 to 11

| Example | Water-soluble Reactive Compound |
| --- | --- |
| 6 | Polyethylene glycol diacrylate (SR268, a product of Nippon Kayaku Co., Ltd.; EO-chain length: 4; molecular weight: 302) |
| 7 | Polyethylene glycol diacrylate (SR344, a product of Nippon Kayaku Co., Ltd.; EO-chain length: 9; molecular weight: 508) |
| 8 | Polyethylene glycol diacrylate (SR610, a product of Nippon Kayaku Co., Ltd.; EO-chain length: 15; molecular weight: 708) |
| 9 | Ethoxidized bisphenol A dimethacrylate (SR480, a product of Nippon Kayaku Co., Ltd.; number of EOs added: 10 in mole terms; molecular weight: 776) |
| 10 | Ethoxidized bisphenol A dimethacrylate (SR9036, a product of Nippon Kayaku Co., Ltd.; number of EOs added: 30 in mole terms; molecular weight: 1656) |
| 11 | Acid phosphoxy polyoxyethylene glycol monomethacrylate (Phosmer PE, a product of Uni-Chemical Co., Ltd.; number of EOs added: 4 to 5 in mole terms; molecular weight: about 364) |

Example 12

A heat-sensitive lithographic printing plate was prepared same manner as in Example 2, except that 0.2 g of acid oxy polyoxyethylene glycol monomethacrylate (Phosmer PE, ct of Uni-Chemical Co., Ltd.; number of EOs added: 4 to 5 in mole terms; molecular weight: about 364) as a water-soluble reactive compound was further added to the coating composition (2) of Example 2. Then, the thus prepared heat-sensitive lithographic printing plate was subjected to imagewise exposure and printing in the same manner as in Example 1. Therein, the printing plate was developed on the printing press without any problems, and enabled printing. When quality evaluation of the tenth sheet printed from the printing plate was made by means of a 20× loupe, it was found that no scum developed and the densities of filled-in image areas were extremely consistent. By further continuation of printing, at least 20,000 sheets of good-quality prints having neither fine-line dropouts, nor fine-character dropouts, nor unevenness in densities of filled-in image areas were obtained.

Example 13

A heat-sensitive lithographic printing plate was prepared in the same manner as in Example 1, except that the image-forming layer was formed using a coating solution (3) having the following composition in place of the coating solution (1).

| Coating Solution (3) for Image-forming Layer: | |
| --- | --- |
| Water | 90 g |
| Propylene glycol monomethyl ether | 10 g |
| Microcapsules (3) (on a solids basis) | 5 g |
| Water-soluble reactive compound [ethoxidized trimethylolpropane triacrylate (containing 15 moles of EO added and having molecular weight of 1,000, SR9035 produced by Nippon Kayaku Co., Ltd.) | 0.2 g |
| Water-soluble reactive compound [Acid phosphoxy polyoxyethylene glycol monomethacrylate (containing 4 to 5 moles of EO added and having molecular weight of about 364, Phosmer PE produced by Uni-Chemical Co., Ltd.) | 0.2 g |
| Reaction accelerator (AS-10, illustrated in the specification) | 0.5 |
| Light-to-heat converting agent (IR-12, illustrated in the specification) | 0.15 g |
| Fluorine-containing surfactant (Megafac F-171, a product of Dainippon Ink & Chemicals, Incorporated). | 0.05 g |

When the thus prepared heat-sensitive lithographic printing plate was subjected to imagewise exposure and printing in the same manner as in Example 1, it was developed on the printing press without any problems, and enabled printing. As a result of quality evaluation of the tenth-printed sheet by means of a 20× loupe, it was found that no scum developed and the densities of filled-in image areas were extremely consistent. When printing was further continued, at least 20,000 sheets of good-quality prints having neither fine-line dropouts, nor fine-character dropouts, nor unevenness in densities of filled-in image areas were obtained.

Comparative Example 1

A heat-sensitive lithographic printing plate was prepared in the same manner as in Example 1, except that the coating solution (1) of Example 1 from which the water-soluble reactive compound, 1,4-butanediol diglycidyl ether, had been removed was used for forming an image-forming layer. Then, the thus prepared heat-sensitive lithographic printing plate was subjected to imagewise exposure and printing in the same manner as in Example 1, and quality evaluation of the tenth-printed sheet was made by means of a 20× loupe. As a result, scum was found on the printed sheet. However, no scumming was observed on the 25th-printed sheet. By further continuation of printing, image densities began lowering after the printing of 15,000 sheets was done, so there emerged a need for increasing the amount of ink supplied.

Comparative Example 2

A heat-sensitive-lithographic printing plate was prepared in the same manner as in Example 2, except that the coating solution (2) of Example 2 from which the water-soluble reactive compound, ethoxidized trimethylolpropane triacrylate, had been removed was used for forming an image-forming layer. Then, the thus prepared heat-sensitive lithographic printing plate was subjected to imagewise exposure and printing in the same manner as in Example 2, and quality evaluation of the tenth-printed sheet was made by means of a 20× loupe. As a result, scum was found on the printed sheet. However, no scumming was observed on the 25th-printed sheet. By further continuation of printing, image densities began lowering after the printing of 15,000 sheets was done, so there emerged a need for increasing the amount of ink supplied.

As can be seen from the results obtained in the foregoing Examples, the present heat-sensitive lithographic printing plates using water-soluble reactive compounds had excellent on-press developability, high resistance to scumming and a long press life.

This application is based on Japanese patent applications JP-2003-038329, filed on Feb. 17, 2003 and JP-2003-271377, filed on Jul. 7, 2003, the entire content of which is hereby incorporated by reference, the same as if set forth at length.

What is claimed is:

1. A heat-sensitive lithographic printing plate comprising:

a support with a hydrophilic surface; and an image-forming layer containing a microcapsule, a light-to-heat converting agent and a water-soluble compound, wherein the image-forming layer contains the water-soluble compound outside the microcapsule and the microcapsule contains a reactive group-containing hydrophobic compound, the reactive group in the microcapsule is an epoxy group or vinyloxy group and the water soluble compound has at least two reactive groups capable of reacting with the hydrophobic compound in the molecule and the at least two reactive groups include a vinyloxy group.

2. The heat-sensitive lithographic printing plate as described in claim 1, wherein the reactive group-containing hydrophobic compound is a vinyloxy group-containing compound obtained by reaction of a active hydrogen-containing vinyloxy compound represented by the following formula (IV), (V) or (VI) with an isocyanate group-containing compound:

$$CH_2{=}CH{-}O{-}R^5{-}OH \quad (IV)$$

$$CH_2{=}CH{-}O{-}R^5{-}COOH \quad (V)$$

$$CH_2{=}CH{-}O{-}R^5{-}NH_2 \quad (VI)$$

wherein $R^5$ represents a straight-chain or branched alkylene group containing 1 to 10 carbon atoms.

3. The heat-sensitive lithographic printing plate as described in claim 1, wherein the reactive group-containing hydrophobic compound is a glycidyl ether compound obtained by reaction of a polyhydric alcohol or polyhydric phenol with epichlorohydrin or prepolymer thereof.

4. The heat-sensitive lithographic printing plate as described in claim 1, wherein the at least two reactive groups include a radical-polymerizable ethylenic unsaturated group.

5. The heat-sensitive lithographic printing plate as described in claim 1, wherein the at least two reactive groups include an epoxy group.

6. The heat-sensitive lithographic printing plate as described in claim 1, wherein the water-soluble compound has at least one of an ethylene oxide chain and a propylene oxide chain in the molecule.

7. The heat-sensitive lithographic printing plate as described in claim 6, wherein the water-soluble compound has the at least one of an ethylene oxide chain and a propylene oxide chain in an amount of 1 to 40 units.

8. The heat-sensitive lithographic printing plate as described in claim 1, wherein the image-forming layer contains the water-soluble compound in an amount of 0.1 to 15% by weight.

9. The heat-sensitive lithographic printing plate as described in claim 1, wherein the water-soluble compound has a molecular weight of 2,000 or below.

10. The heat-sensitive lithographic printing plate as described in claim 1, wherein the image-forming layer further contains a hydrophilic resin.

11. The heat-sensitive lithographic printing plate as described in claim 1, wherein the image-forming layer further contains a reaction accelerator capable of initiating or accelerating the reaction between the reactive groups of the hydrophobic compound and the water-soluble compound.

12. The heat-sensitive lithographic printing plate as described in claim 1, which further comprises an overcoat layer containing a water-soluble resin on the image-forming layer.

13. A heat-sensitive lithographic printing plate comprising:

a support with a hydrophilic surface; and an image-forming layer containing a microcapsule, a light-to-heat converting agent and a water-soluble compound, wherein the image-forming layer contains the water-soluble compound outside the microcapsule and the microcapsule contains a reactive group-containing hydrophobic compound, the reactive group in the microcapsule is a radical polymerizable ethylenic unsaturated group and the water soluble compound has at least two reactive groups capable of reacting with the hydrophobic compound in the molecule and the at least two reactive groups include a vinyloxy group and a radical polymerizable ethylenic unsaturated group.

14. A heat-sensitive lithographic printing plate comprising:

a support with a hydrophilic surface; and an image-forming layer containing a microcapsule, a light-to-heat converting agent and a water-soluble compound, wherein the microcapsule contains a reactive group-containing hydrophobic compound, the water-soluble compound has a reactive group capable of reacting with the hydrophobic compound and the image-forming layer contains the water-soluble compound outside the microcapsule, wherein the reactive group-containing hydrophobic compound has at least two reactive groups, that include at least two vinyloxy groups in the molecule.

15. The heat-sensitive lithographic printing plate as described in claim 14, wherein the reactive group-containing hydrophobic compound is a vinyl ether group-containing compound represented by the following formula (II) or (III):

$$A\text{-}[{-}O{-}(R^4{-}O)_n{-}CH{=}CH_2]_m \quad (II)$$

$$A\text{-}[{-}B{-}R^4{-}O{-}CH{=}CH_2]_m \quad (III)$$

wherein A represents an m-valent saturated hydrocarbon group, aromatic hydrocarbon group or heterocyclic group, B represents —CO—O—, —NHCOO—or —NHCONH—, $R^4$ represents a straight-chain or branched alkylene group containing 1 to 10 carbon atoms, n represents an integer of 0 to 10, and m represents an integer of 2 to 6.

16. The heat-sensitive lithographic printing plate as described in claim 14, wherein the reactive group-containing hydrophobic compound has at least two epoxy groups in the molecule.

17. The heat-sensitive lithographic printing plate as described in claim 14, wherein the reactive group-containing hydrophobic compound has at least two radical-polymerizable ethylenic unsaturated groups.

18. The heat-sensitive lithographic printing plate as described in claim 17, wherein the radical-polymerizable ethylenic unsaturated group includes at least one of an acryloyl, methacryloyl, vinyl and allyl group.

* * * * *